(12) United States Patent
Park et al.

(10) Patent No.: US 11,201,307 B2
(45) Date of Patent: Dec. 14, 2021

(54) DISPLAY PANEL AND ELECTRONIC APPARATUS INCLUDING THE SAME

(71) Applicant: SAMSUNG DISPLAY CO., LTD., Yongin-si (KR)

(72) Inventors: Junhyun Park, Suwon-si (KR); Ansu Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 10 days.

(21) Appl. No.: 16/386,187

(22) Filed: Apr. 16, 2019

(65) Prior Publication Data

US 2019/0319212 A1    Oct. 17, 2019

(30) Foreign Application Priority Data

Apr. 17, 2018  (KR) .................. 10-2018-0044492
Apr. 5, 2019   (KR) .................. 10-2019-0040429

(51) Int. Cl.
*H01L 51/52*   (2006.01)
*H01L 27/32*   (2006.01)

(52) U.S. Cl.
CPC .......... *H01L 51/52* (2013.01); *H01L 27/3223* (2013.01); *H01L 27/3276* (2013.01)

(58) Field of Classification Search
CPC .............. H01L 27/326; H01L 27/3272; H01L 51/5237
See application file for complete search history.

(56) References Cited

U.S. PATENT DOCUMENTS

| | | | |
|---|---|---|---|
| 9,851,605 B2 | 12/2017 | Watanabe et al. | |
| 9,898,952 B2 | 2/2018 | Fujii | |
| 2017/0150618 A1 | 5/2017 | Choi et al. | |
| 2017/0162111 A1 | 6/2017 | Kang et al. | |
| 2017/0162637 A1 | 6/2017 | Choi et al. | |
| 2017/0288004 A1* | 10/2017 | Kim | H01L 27/3276 |
| 2019/0288047 A1 | 9/2019 | Jeong et al. | |
| 2020/0381488 A1* | 12/2020 | Lesonen | G06F 3/0412 |

FOREIGN PATENT DOCUMENTS

| | | |
|---|---|---|
| KR | 10-2016-0124338 | 10/2016 |
| KR | 10-2017-0059527 | 5/2017 |
| KR | 10-2017-0065059 | 6/2017 |
| KR | 10-2017-0066767 | 6/2017 |
| KR | 10-1800669 | 12/2017 |
| KR | 10-2019-0108212 A | 9/2019 |

\* cited by examiner

*Primary Examiner* — Moazzam Hossain
*Assistant Examiner* — Stanetta D Isaac
(74) *Attorney, Agent, or Firm* — Lewis Roca Rothgerber Christie LLP

(57) ABSTRACT

A display panel includes an insulating substrate in which at least one hole is defined, wherein the insulating substrate comprises a hole area in which the hole is defined, a display area surrounding the hole area, and a peripheral area adjacent to the display area, a plurality of pixels in the display area, a plurality of main signal lines in the display area and electrically connected to the pixels, and a plurality of sub-signal lines in the hole area and electrically connected to the pixels, wherein the hole area comprises a line area which surrounds the hole and in which the sub-signal lines are located, and a compensation area between the line area and the display area in a plan view and configured to display a black color.

24 Claims, 26 Drawing Sheets

DISPLAY PANEL AND ELECTRONIC APPARATUS INCLUDING THE SAME

CROSS-REFERENCE TO RELATED APPLICATION

This application claims priority to and the benefit of Korean Patent Application No. 10-2019-0040429, filed on Apr. 5, 2019, and Korean Patent Application No. 10-2018-0044492, filed on Apr. 17, 2018, the entire contents of which are hereby incorporated by reference.

BACKGROUND

1. Field

The present disclosure herein relates to a display panel in which at least one hole is defined, and an electronic apparatus including the same.

2. Description of the Related Art

An electronic apparatus is activated by an electrical signal. An electronic apparatus may include a display device for displaying an image and/or a touch sensing device for sensing an external input. An organic light emitting display device used as an example of the type of display device may have relatively low power consumption, high brightness, and high response speed characteristics.

The organic light emitting display device may include an organic light emitting element. However, the organic light emitting element may be easily damaged by moisture or oxygen. Thus, external moisture or oxygen should be stably blocked to improve the life span and reliability of the organic light emitting display device.

SUMMARY

The present disclosure provides a display panel capable of preventing various defects from being visible in an area adjacent to a hole, and an electronic apparatus including the same.

In an embodiment of the present disclosure, a display panel comprises an insulating substrate in which at least one hole is defined, wherein the insulating substrate comprises a hole area in which the hole is defined, a display area surrounding the hole area, and a peripheral area adjacent to the display area, a plurality of pixels in the display area, a plurality of main signal lines in the display area and electrically connected to the pixels, and a plurality of sub-signal lines in the hole area and electrically connected to the pixels, wherein the hole area comprises a line area which surrounds the hole and in which the sub-signal lines are located, and a compensation area between the line area and the display area in a plan view and configured to display a black color.

The display panel may further include an optically opaque metal pattern in the compensation area and spaced apart from the pixels in a plan view.

The metal pattern may be a floating electrode.

The metal pattern may be configured to receive a ground voltage.

The metal pattern may be configured to receive the same voltage as one of the sub-signal lines.

The metal pattern and the sub-signal lines may be on the same layer.

The main signal lines may be on a layer that is different from the layer on which the sub-signal lines are located.

The metal pattern may be on a layer that is different from a layer on which the sub-signal lines are located.

At least one of the sub-signal lines may be on the same layer as at least one of the main signal lines.

The metal pattern may extend into the line area and may overlap with the sub-signal lines in a plan view.

The display panel may further include an encapsulation layer covering the pixels, and the metal pattern may be on the encapsulation layer.

The display panel may further include a plurality of light emitting elements in the compensation area and spaced apart from the pixels in a plan view.

Each of the light emitting elements may be electrically connected to at least one of the main signal lines or the sub-signal lines, and each of the light emitting elements may be configured to display light of a black color.

Each of the light emitting elements may be electrically insulated from the main signal lines and the sub-signal lines.

The insulating substrate may define a plurality of holes spaced apart from each other, and the hole area may define a plurality of hole areas respectively overlapping with the holes and spaced apart from each other. Each of compensation areas of the hole areas may extend along an edge of each of the holes.

The insulating substrate may define a plurality of holes spaced apart from each other, and the hole area may be provided as a single area overlapping with all of the holes. The holes may be surrounded by a single compensation area in a plan view.

In an embodiment of the inventive concepts, an electronic apparatus comprises a display panel comprising a hole area defining a through-hole and configured to display a black color, and a display area surrounding the hole area and configured to display an image by an electrical signal, and an electronic module under the display panel and overlapping with the hole area, wherein the hole area comprises a line area surrounding the through-hole, and a compensation area between the line area and the display area and surrounding the line area, wherein the display panel comprises a plurality of pixels in the display area, a plurality of main signal lines in the display area and connected to the pixels, a plurality of sub-signal lines in the line area and connected to the main signal lines, and a compensation element in the compensation area and configured to display a black color.

The compensation element may comprise an optically opaque metal pattern covering the compensation area and spaced apart from the pixels in a plan view.

The metal pattern may overlap with at least one of the main signal lines or the sub-signal lines when viewed in a plan view.

Each of the pixels may include a thin film transistor, and a light emitting element connected to the thin film transistor, wherein the compensation element has a structure obtained by omitting at least one of the thin film transistor or components of the light emitting element from the pixel.

The compensation element may comprise a first electrode electrically insulated from the main signal lines and the sub-signal lines, a second electrode, and an emission layer between the first and second electrodes.

The first electrode may be a floating electrode.

The compensation element may have the same structure as at least one of the pixels, and is configured to generate light of a black color.

The sub-signal lines may have curved line shapes extending along at least a portion of an edge of the through-hole, and the main signal lines may have straight line shapes.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
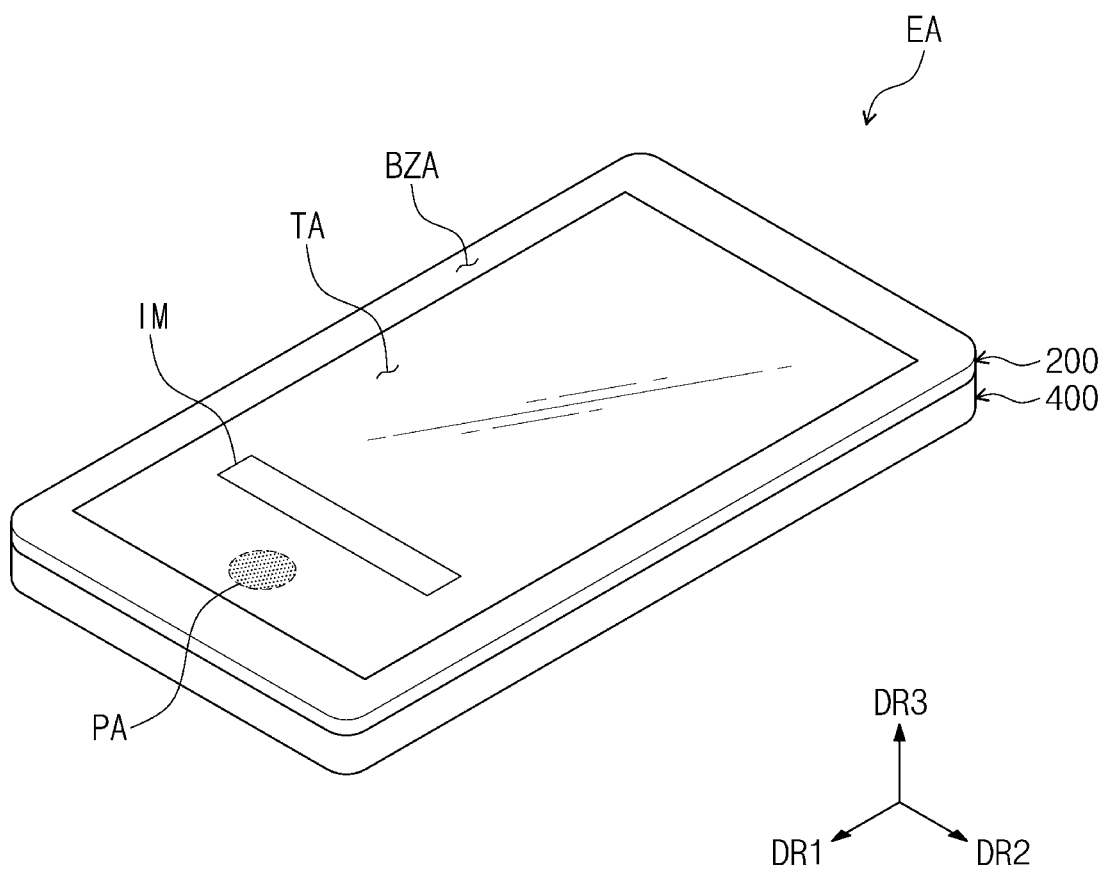
FIG. 1 is a perspective view illustrating an electronic apparatus according to an embodiment of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
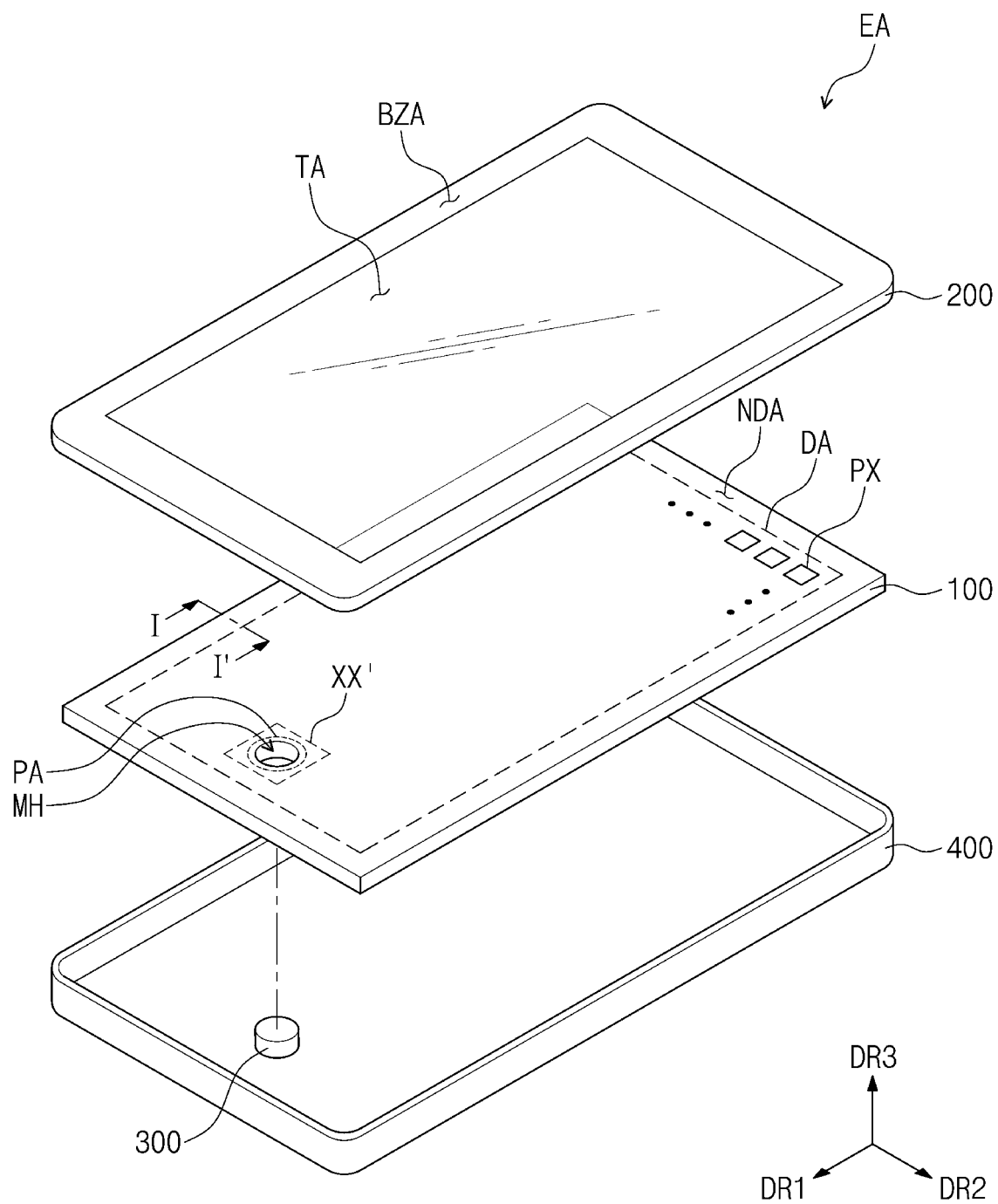
FIG. 2A is an exploded perspective view illustrating the electronic apparatus of FIG. 1.
Figure 2B:
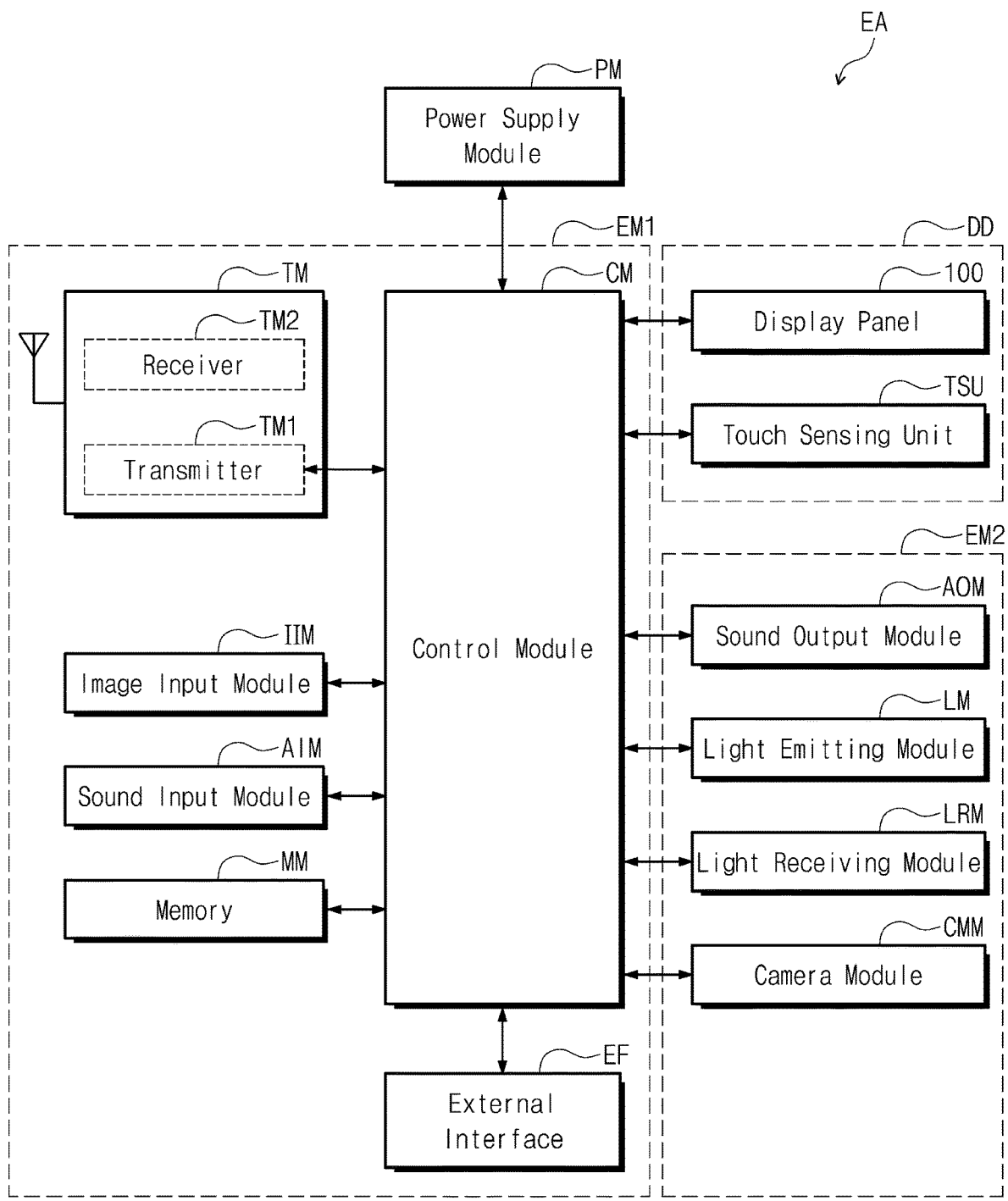
FIG. 2B is a block diagram of the electronic apparatus of FIG. 1.

FIG. 1 is a perspective view illustrating an electronic apparatus according to an embodiment of the present disclosure. FIG. 2A is an exploded perspective view illustrating the electronic apparatus of FIG. 1. FIG. 2B is a block diagram of the electronic apparatus of FIG. 1. Hereinafter, the electronic apparatus according to an embodiment of the present disclosure will be described with reference to FIGS. 1, 2A and 2B.

An electronic apparatus EA may be activated by an electrical signal. The electronic apparatus EA may be realized as various embodiments. For example, the electronic apparatus EA may be realized as a tablet, a notebook computer, a personal computer, a smart television, or a smart phone. In the present embodiment, the smart phone is illustrated as an example of the electronic apparatus EA.

As illustrated in FIG. 1, the electronic apparatus EA may provide a display surface for displaying an image IM at its front surface. The display surface may be parallel to a plane defined by a first direction DR1 and a second direction DR2.

The display surface may include a transmission area TA and a bezel area BZA adjacent to the transmission area TA.

The electronic apparatus EA may display the image IM in the transmission area TA. In FIG. 1, an internet search box is illustrated as an example of the image IM. The transmission area TA may have a quadrilateral shape (or a rectangular shape) parallel to the first and second directions DR1 and DR2. However, embodiments of the present disclosure are not limited thereto. In other embodiments, the shape of the transmission area TA may be variously modified.

The bezel area BZA may be adjacent to the transmission area TA. The bezel area BZA may surround the transmission area TA when viewed in a plan view. However, embodiments of the present disclosure are not limited thereto. In other embodiments, the bezel area BZA may be adjacent to only one side of the transmission area TA, or may be omitted. The electronic apparatus EA according to the embodiment of the present disclosure may be variously embodied and is not limited to a specific embodiment.

A normal direction of the display surface may correspond to a thickness direction DR3 (hereinafter, referred to as a third direction) of the electronic apparatus EA. In the present embodiment, a front surface (or a top surface) and a rear surface (or a bottom surface) of each member are defined by a direction (e.g., the third direction DR3) in which the image IM is displayed. The front surface and the rear surface are opposite to each other in the third direction DR3.

However, directions indicated by the first to third directions DR1, DR2 and DR3 may be relative concepts, and may be changed into other directions.

As illustrated in FIG. 2A, the electronic apparatus EA may include a display panel 100, a window member 200, an electronic module 300, and a receiving member 400. In more detail, as illustrated in FIG. 2B, the electronic apparatus EA may include a display module DD, a first electronic module EM1, a second electronic module EM2, and a power supply module PM. Some components illustrated in FIG. 2B are omitted in FIG. 2A. Hereinafter, the electronic apparatus EA will be described in more detail with reference to FIGS. 2A and 2B.

The display module DD may include the display panel 100 and a touch sensing unit TSU. The display panel 100 may generate the image IM. In an embodiment, the display panel 100 may also sense an external input of a user. In this case, the display panel 100 may further include a touch sensor, and the touch sensing unit TSU may be omitted.

The touch sensing unit TSU may sense an input of a user provided from the outside. The input of a user may include at least one of various external inputs, such as a part (e.g., a finger) of the body of a user, light, heat, and pressure. The touch sensing unit TSU is omitted in FIG. 2A.

Meanwhile, in the present embodiment, the display panel 100 may include a display area DA, a peripheral area NDA, and a hole area PA, which are defined when viewed in a plan view. The display area DA may be an area in which the image IM is generated. The display panel 100 may include a pixel PX located in the display area DA. The pixel PX may be provided in plurality, and the plurality of pixels PX may be arranged in the display area DA. Lights generated from the pixels PX may form the image IM.

The peripheral area NDA may be adjacent to the display area DA. The peripheral area NDA may surround the display area DA when viewed in a plan view. A driving circuit and/or driving lines for driving the display area DA may be located in the peripheral area NDA.

In other embodiments, a portion of the peripheral area NDA of the display panel 100 may be bent. Thus, a portion of the peripheral area NDA may face a front surface of the electronic apparatus EA, and another portion of the peripheral area NDA may face a rear surface of the electronic apparatus EA. Alternatively, the peripheral area NDA may be omitted from the display panel 100 according to an embodiment of the present disclosure.

The hole area PA may be surrounded by the display area DA when viewed in a plan view. The hole area PA may be spaced apart from the peripheral area NDA with the display area DA interposed therebetween. The display panel 100 according to an embodiment of the present disclosure may include at least one module hole MH. The module hole MH may be located in the hole area PA. Thus, the module hole MH may be surrounded by the display area DA for displaying the image IM when viewed in a plan view.

The module hole MH may penetrate the display panel 100. The module hole MH may have a cylindrical shape having a height in the third direction DR3. The module hole MH may overlap with the electronic module 300 when viewed in a plan view. The electronic module 300 may be received in the module hole MH, and/or may have a similar size to that of the module hole MH. The electronic module 300 may receive an external input through the module hole MH. The electronic module 300 will be described later in more detail.

According to an embodiment of the present disclosure, because the display panel 100 includes the module hole MH, a separate space for the electronic module 300 might not be provided in the peripheral area NDA. Thus, an area (or a size) of the peripheral area NDA may be reduced to realize the electronic apparatus EA having a narrow bezel. In addition, when the electronic module 300 is received in the module hole MH, a thin electronic apparatus EA may be realized.

The window member 200 may provide the front surface of the electronic apparatus EA. The window member 200 may be located on the front surface of the display panel 100 to protect the display panel 100. For example, the window member 200 may include a glass substrate, a sapphire substrate, or a plastic film. The window member 200 may have a single-layered or multi-layered structure. For example, the window member 200 may have a stack structure including a plurality of plastic films coupled to each other by an adhesive or may have a stack structure that includes a glass substrate and a plastic film coupled to each other by an adhesive.

The window member 200 may include the transmission area TA and the bezel area BZA. The transmission area TA may correspond to the display area DA. For example, the transmission area TA may overlap with an entirety of, or at least a portion of, the display area DA. The image IM displayed in the display area DA of the display panel 100 may be visible to the outside through the transmission area TA.

The bezel area BZA may define the shape of the transmission area TA. The bezel area BZA may be adjacent to the transmission area TA and may surround the transmission area TA in a plan view. The bezel area BZA may have a color (e.g., a predetermined color). The bezel area BZA may cover the peripheral area NDA of the display panel 100 to reduce or prevent visibility of the peripheral area NDA to the outside. However, embodiments of the present disclosure are not limited thereto. In another embodiment of the present disclosure, the bezel area BZA may be omitted in the window member 200.

The power supply module PM may supply power for overall operations of the electronic apparatus EA. The power supply module PM may include a battery module.

The receiving member 400 may be coupled to the window member 200. The receiving member 400 may provide a rear surface of the electronic apparatus EA. The receiving member 400 may be coupled to the window member 200 to define an inner space, and the display panel 100, the electronic module 300, and various components of FIG. 2B may be received in the inner space. The receiving member 400 may be formed of a material having relatively high rigidity. For example, the receiving member 400 may include a plurality of frames and/or plates, which are formed of glass, plastic, and/or a metal. The receiving member 400 may stably protect the components of the electronic apparatus EA received in the inner space from an external impact.

The electronic module 300 may include various functional modules for operating the electronic apparatus EA. As described above, the electronic module 300 may receive an external input transferred through the module hole MH, and/or may provide an output signal through the module hole MH. The electronic module 300 may include at least one of components of the first electronic module EM1 or components of the second electronic module EM2.

The first electronic module EM1 may be mounted directly on a motherboard electrically connected to the display module DD. In an alternative embodiment, the first electronic module EM1 may be mounted on an additional board so as to be electrically connected to the motherboard through a connector.

The first electronic module EM1 may include a control module CM, a wireless communication module TM, an image input module IIM, a sound input module AIM, a memory MM, and an external interface EF. In an embodiment, some of the components (i.e., the modules) may be electrically connected to the motherboard through a flexible circuit board instead of mounted on the motherboard.

The control module CM may control overall operations of the electronic apparatus EA. The control module CM may include a microprocessor. For example, the control module CM may activate or deactivate the display module DD. The control module CM may control one or more other modules (e.g., the image input module IIM, the sound input module AIM, etc.) on the basis of a touch signal received from the display module DD.

The wireless communication module TM may transmit/receive a wireless signal to/from one or more other terminals by using Bluetooth or Wi-Fi. The wireless communication module TM may transmit/receive a voice signal by using a general communication line. The wireless communication module TM may include a transmitter TM1, which is configured to modulate a signal to be transmitted and to transmit the modulated signal, and a receiver TM2, which is configured to demodulate a received signal.

The image input module IIM may process image signals to convert the image signals into image data usable in the display module DD. The sound input module AIM may receive an external sound signal through a microphone in a recording mode or in a voice recognition mode, and may convert the received sound signal into electrical sound data.

The external interface EF may be connected to, and interface with, an external charger, a cable/wireless data port, and/or a card socket (e.g., a memory card or a SIM/UIM card).

The second electronic module EM2 may include a sound output module AOM, a light emitting module LM, a light receiving module LRM, and a camera module CMM. The components of the second electronic module EM2 may be mounted directly on the motherboard, or may be mounted on an additional board so as to be electrically connected to the display module DD and/or the first electronic module EM1 through a connector in other embodiments.

The sound output module AOM may convert sound data received from the wireless communication module TM and/or sound data stored in the memory MM and may output the converted sound data to the outside.

The light emitting module LM may generate light, and may output the generated light. The light emitting module LM may output infrared light. The light emitting module LM may include a light emitting diode (LED) element. The light receiving module LRM may sense infrared light. The light receiving module LRM may be activated when sensing the infrared light (e.g., infrared light of a predetermined level or more). The light receiving module LRM may include a CMOS sensor. After the infrared light generated in the light emitting module LM is outputted, the infrared light may be reflected by an external object (e.g., a finger or a face of a user), and the reflected infrared light may be incident to the light receiving module LRM. The camera module CMM may acquire an external image.

The electronic module 300 illustrated in FIG. 2A may include at least one of the components (e.g., one of the modules) of the first and second electronic modules EM1 and EM2. For example, the electronic module 300 may include a camera, a speaker, and/or a sensor for sensing light or heat. The electronic module 300 may sense an external object through the module hole MH and/or may provide a sound signal (e.g., a voice) to the outside through the module hole MH. In this case, the other components of the first and second electronic modules EM1 and EM2 may be located at other positions, and thus are not shown in FIG. 2A. However, embodiments of the present disclosure are not limited thereto. In other embodiments, the electronic module 300 may include at least two of the components of the first and second electronic modules EM1 and EM2.

Figure 3A:
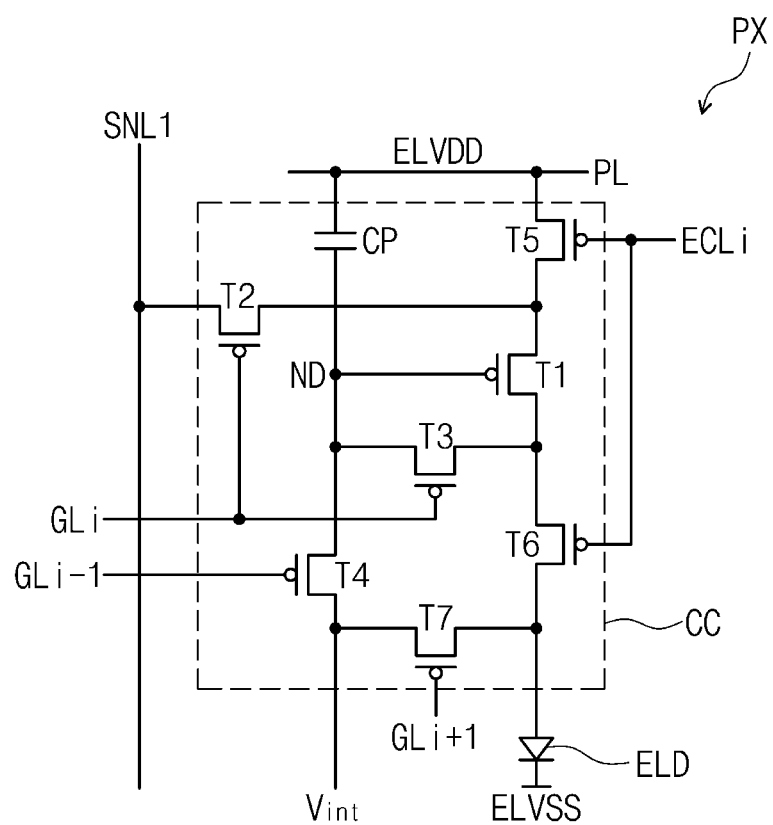
FIG. 3A is an equivalent circuit diagram schematically illustrating a component of FIG. 2A.
Figure 3B:
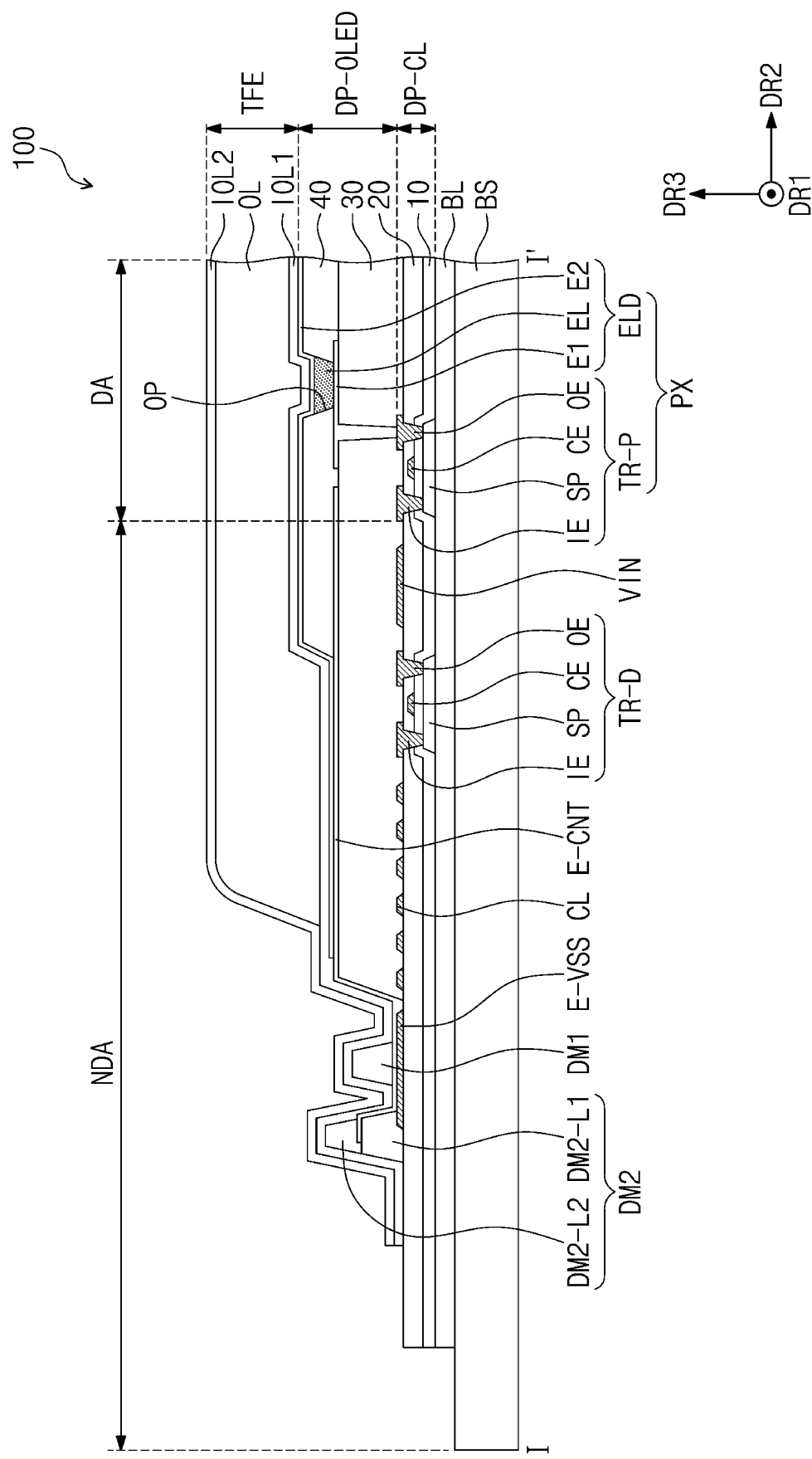
FIG. 3B is a cross-sectional view taken along the line I-I' of FIG. 2A.

FIG. 3A is an equivalent circuit diagram schematically illustrating a component of FIG. 2A. FIG. 3B is a cross-sectional view taken along the line I-I' of FIG. 2A. For the purpose of ease and convenience in description and illustration, an equivalent circuit diagram of one pixel PX is illustrated in FIG. 3A, and some of the components of the pixel PX of FIG. 3A are omitted in FIG. 3B. Hereinafter, an embodiment of the present disclosure will be described in detail with reference to FIGS. 3A and 3B.

The display panel 100 may include an insulating substrate BS, a base layer BL, a circuit layer DP-CL, a display element layer DP-OLED, and an encapsulation layer TFE.

The insulating substrate BS may include an insulating material. The insulating substrate BS may include a flexible material. For example, the insulating substrate BS may include polyimide (PI). However, embodiments of the present disclosure are not limited thereto. In other embodiments, the insulating substrate BS may be rigid, or the insulating substrate BS may be formed of at least one of various materials, such as glass and plastic.

The pixel PX may be located on the insulating substrate BS. The pixel PX may be located in a display area DA of the insulating substrate BS, as described above.

Referring to FIG. 3A, the pixel PX may be connected to a plurality of signal lines. In the present embodiment, the pixel PX connected to an i-th gate line GLi and an i-th emission control line ECLi of the signal lines is illustrated as an example. However, embodiments of the present disclosure are not limited thereto. In another embodiment, the pixel PX may be additionally connected to one or more other various signal lines.

A light emitting element ELD may include a light emitting material. The light emitting element ELD may generate light having a color based on the light emitting material. For example, the color of the light generated from the light emitting element ELD may be a red color, a green color, a blue color, or a white color.

The pixel PX may include the light emitting element ELD and a pixel circuit CC. The pixel circuit CC may include a plurality of transistors T1 to T7 and a capacitor CP. The pixel circuit CC may control the amount of a current flowing through the light emitting element ELD in response to a data signal.

The light emitting element ELD may emit light of a predetermined brightness in response to the amount of the current provided from the pixel circuit CC. A level of a first power source ELVDD may be set to be higher than a level of a second power source ELVSS.

A capacitor CP may be connected between a power line PL and a node ND. The capacitor CP may store a voltage corresponding to the data signal. When a fifth transistor T5 and a sixth transistor T6 are turned on, the amount of a current flowing through a first transistor T1 may be determined by the voltage stored in the capacitor CP.

Each of the plurality of transistors T1 to T7 may include an input electrode (or a source electrode), an output electrode (or a drain electrode), and a control electrode (or a gate electrode).

The input electrode of the first transistor T1 may be connected to the power line PL via the fifth transistor T5, and the output electrode of the first transistor T1 may be connected to the light emitting element ELD via the sixth transistor T6. The first transistor T1 may be referred to as a driving transistor in the present disclosure. The first transistor T1 may control the amount of the current flowing through the light emitting element ELD in response to a voltage applied to the control electrode of the first transistor T1.

A second transistor T2 may be connected between a first signal line SNL1 and the input electrode of the first transistor T1. The control electrode of the second transistor T2 may be connected to the i-th gate line GLi. When an i-th scan signal is provided to the i-th gate line GLi, the second transistor T2 may be turned on to electrically connect the first signal line SNL1 and the input electrode of the first transistor T1.

A third transistor T3 may be connected between the output electrode of the first transistor T1 and the control electrode of the first transistor T1. The control electrode of the third transistor T3 may be connected to the i-th gate line GLi. When the i-th scan signal is provided to the i-th gate line GLi, the third transistor T3 may be turned on to electrically connect the output electrode of the first transistor T1 and the control electrode of the first transistor T1. When the third transistor T3 is turned on, the first transistor T1 may be operated in a diode type.

A fourth transistor T4 may be connected between the node ND and an initialization power source generator. The control electrode of the fourth transistor T4 may be connected to an (i−1)-th gate line GLi−1. When an (i−1)-th scan signal is provided to the (i−1)-th gate line GLi−1, the fourth transistor T4 may be turned on to provide an initialization voltage Vint to the node ND.

The fifth transistor T5 may be connected between the power line PL and the input electrode of the first transistor T1. The control electrode of the fifth transistor T5 may be connected to the i-th emission control line ECLi.

The sixth transistor T6 may be connected between the output electrode of the first transistor T1 and the light emitting element ELD. The control electrode of the sixth transistor T6 may be connected to the i-th emission control line ECLi.

A seventh transistor T7 may be connected between the initialization power source generator and the light emitting element ELD. The control electrode of the seventh transistor T7 may be connected to an (i+1)-th gate line GLi+1. When an (i+1)-th scan signal is provided to the (i+1)-th gate line GLi+1, the seventh transistor T7 may be turned on to provide the initialization voltage Vint to the light emitting element ELD.

The seventh transistor T7 may improve black display capability of the pixel PX. In detail, when the seventh transistor T7 is turned on, a parasitic capacitor/parasitic capacitance of the light emitting element ELD may be discharged. Thus, it is possible to inhibit or prevent a phenomenon in which the light emitting element ELD emits light by a leakage current provided from the first transistor T1 when a black color is displayed. As a result, expression of the black color may be improved.

The control electrode of the seventh transistor T7 is connected to the (i+1)-th gate line GLi+1 in FIG. 3A. However, embodiments of the present disclosure are not limited thereto. In other embodiments, the control electrode of the seventh transistor T7 may be connected to the i-th gate line GLi or the (i−1)-th gate line GLi−1.

In FIG. 3A, PMOS transistors are illustrated as an example. However, embodiments of the present disclosure are not limited thereto. In other embodiments, the pixel circuit CC may be composed of NMOS transistors or may be composed of a combination of NMOS and PMOS transistors. A pixel transistor TR-P and the light emitting element ELD of the components of the pixel PX are illustrated in FIG. 3B. The pixel transistor TR-P may correspond to the sixth transistor T6 of FIG. 3A. The pixel transistor TR-P may be located on the insulating substrate BS.

The pixel transistor TR-P may be included in the circuit layer DP-CL. In the present embodiment, the display panel 100 may include the base layer BL located between the circuit layer DP-CL and the insulating substrate BS. The base layer BL may include a single insulating layer or a plurality of insulating layers. For example, the base layer BL may include at least one of a buffer layer or a barrier layer. Thus, the circuit layer DP-CL may be stably formed on the base layer BL, and the base layer BL may prevent oxygen or moisture from permeating into the circuit layer DP-CL through the insulating substrate BS.

The pixel transistor TR-P may include a semiconductor pattern SP, a control electrode CE, an input electrode IE, and an output electrode OE. The control electrode CE of the pixel transistor TR-P may be spaced apart from the semiconductor pattern SP with a first insulating layer 10 interposed therebetween.

The input electrode IE and the output electrode OE of the pixel transistor TR-P may be spaced apart from the control electrode CE of the pixel transistor TR-P with a second insulating layer 20 interposed therebetween. The input electrode IE and the output electrode OE of the pixel transistor TR-P may penetrate the first and second insulating layers 10 and 20 so as to be connected to one side portion and another side portion of the semiconductor pattern SP, respectively.

In other embodiments, in the pixel transistor TR-P, the control electrode CE may be located under the semiconductor pattern SP, and/or the input electrode IE and the output electrode OE may be located under the semiconductor pattern SP, or may be located on the same layer as the semiconductor pattern SP so as to be connected directly to the semiconductor pattern SP. The pixel transistor TR-P according to an embodiment of the present disclosure may have any one of various structures, and is not limited to a specific embodiment.

The light emitting element ELD may be located on a third insulating layer 30. The light emitting element ELD and a fourth insulating layer 40 may be included in the display element layer DP-OLED. The light emitting element ELD may include a first electrode E1, an emission layer EL, and a second electrode E2, which are sequentially stacked in the third direction DR3.

The first electrode E1 may penetrate the third insulating layer 30 so as to be connected to the pixel transistor TR-P. Meanwhile, in other embodiments an additional connection electrode may be additionally located between the first electrode E1 and the pixel transistor TR-P. In this case, the first electrode E1 may be electrically connected to the pixel transistor TR-P through the connection electrode.

The fourth insulating layer 40 may be located on the third insulating layer 30. An opening OP may be defined in the fourth insulating layer 40. The opening OP may expose at least a portion of the first electrode E1. The fourth insulating layer 40 may be a pixel defining layer.

The emission layer EL may be located on the first electrode E1. The emission layer EL may include a light emitting material. For example, the emission layer EL may include at least one of materials for emitting red light, green light, and blue light. In an embodiment, the emission layer EL may include a fluorescent material or a phosphorescent material. The emission layer EL may include an organic material and/or an inorganic material. The emission layer EL may emit light in response to a potential difference between the first electrode E1 and the second electrode E2.

The second electrode E2 may be located on the emission layer EL. The second electrode E2 may be opposite to the first electrode E1. The second electrode E2 may be connected to the power source terminal VSS of FIG. 3A. The light emitting element ELD may receive the second power source voltage through the second electrode E2.

The second electrode E2 may include a transparent conductive material or a semi-transparent conductive material. Thus, light generated from the emission layer EL may easily exit in the third direction DR3 through the second electrode E2. However, embodiments of the present disclosure are not limited thereto. In another embodiment, the first electrode E1 may include a transparent or semi-transparent conductive material, and the light emitting element ELD may be driven in a rear surface light emitting type. In still another embodiment, the light emitting element ELD may be driven in a dual surface light emitting type in which light exits through both a front surface and a rear surface.

In other embodiments, the light emitting element ELD may further include at least one organic layer or at least one inorganic layer located between the emission layer EL and the first electrode E1 and/or between the emission layer EL and the second electrode E2. The organic layer or the inorganic layer may control movement of charges flowing from the first and second electrodes E1 and E2 into the emission layer EL to improve light efficiency and life span of the light emitting element ELD.

The encapsulation layer TFE may be located on the light emitting element ELD to encapsulate the light emitting element ELD. In other embodiments, a capping layer covering the second electrode E2 may be located between the second electrode E2 and the encapsulation layer TFE.

The encapsulation layer TFE may include a first inorganic layer IOL1, an organic layer OL and a second inorganic layer IOL2, which are sequentially stacked in the third direction DR3. However, embodiments of the present disclosure are not limited thereto. In another embodiment, the encapsulation layer TFE may further include a plurality of inorganic layers and/or a plurality of organic layers.

The first inorganic layer IOL1 may cover the second electrode E2. The first inorganic layer IOL1 may prevent external moisture and/or oxygen from permeating into the light emitting element ELD. For example, the first inorganic layer IOL1 may include silicon nitride, silicon oxide, silicon oxynitride, or a combination thereof. The first inorganic layer IOL1 may be formed by a deposition process.

The organic layer OL may be located on the first inorganic layer IOL1, and may be in contact with the first inorganic layer IOL1. The organic layer OL may be planarized on the first inorganic layer IOL1. The organic layer OL may cover a bent portion of a top surface of the first inorganic layer IOL1 and/or a particle existing on the first inorganic layer IOL1, and thus the influence of the bent portion and/or the particle on components formed on the organic layer OL may be blocked by the organic layer OL. In addition, the organic layer OL may relax or release stress between layers being in contact with the organic layer OL. The organic layer OL may include an organic material, and may be formed by a solution process, such as a spin coating process, a slit coating process, and/or an inkjet process.

The second inorganic layer IOL2 may be located on the organic layer OL to cover the organic layer OL. The second inorganic layer IOL2 may be stably formed on a top surface of the organic layer OL, which is relatively flat as compared with the top surface of the first inorganic layer IOL1. The second inorganic layer IOL2 may encapsulate moisture outputted from the organic layer OL to prevent the moisture from being provided to the outside. For example, the second inorganic layer IOL2 may include silicon nitride, silicon oxide, silicon oxynitride, or a combination thereof. The second inorganic layer IOL2 may be formed by a deposition process.

In other embodiments, an input sensing unit including a plurality of sensor patterns may be located on the encapsulation layer TFE. The input sensing unit may be formed directly on the encapsulation layer TFE to sense an external input, such as a touch or pressure. The input sensing unit may be, for example, the touch sensing unit TSU of FIG. 2B. However, embodiments of the present disclosure are not limited thereto. One of other various kinds of display panels may be applied to the display panel 100 according to the embodiments of the present disclosure.

On the other hand, the display panel 100 may further include a thin film transistor TR-D (hereinafter, referred to as a driving transistor), conductive patterns E-VSS, E-CNT, VIN, and CL, and a dam portion DM1 and DM2. The driving transistor TR-D and at least some of the conductive patterns E-VSS, E-CNT, VIN, and CL may be included in the circuit layer DP-CL.

The driving transistor TR-D may be located in the peripheral area NDA. In the present embodiment, the driving transistor TR-D may have a structure corresponding to that of the pixel transistor TR-P. For example, the driving transistor TR-D may include a semiconductor pattern SP located on the base layer BL, a control electrode CE located on the first insulating layer 10, and an input electrode IE and an output electrode OE, which are located on the second insulating layer 20. Thus, the pixel transistor TR-P and the driving transistor TR-D may be formed at the same time by the same processes. As a result, processes may be simplified and a process cost may be reduced. However, embodiments of the present disclosure are not limited thereto. In another embodiment, the structure of the driving transistor TR-D may be different from that of the pixel transistor TR-P.

The conductive patterns E-VSS, E-CNT, VIN, and CL may respectively include a power source supply line E-VSS, a connection electrode E-CNT, an initialization voltage line VIN, and a driving signal line CL. The power source supply line E-VSS may correspond to the power source terminal VSS of the pixel PX. Thus, the power source supply line E-VSS may supply the second power source voltage to the light emitting element ELD. In the present embodiment, the second power source voltage supplied to the pixel PX may be a common voltage supplied to all of the pixels PX.

The power source supply line E-VSS may be located on the second insulating layer 20 and may be included in the circuit layer DP-CL. The power source supply line E-VSS may be formed concurrently with the input electrode IE and/or the output electrode OE of the driving transistor TR-D by the same processes. However, embodiments of the present disclosure are not limited thereto. In another embodiment, the power source supply line E-VSS may be located on a layer that is different from a layer on which the input and/or output electrodes IE and/or OE of the driving transistor TR-D are located, and the power source supply line E-VSS may be formed by a process that is different from the process of forming the input and/or output electrodes IE and/or OE of the driving transistor TR-D.

The connection electrode E-CNT may be located on the third insulating layer 30 and may be included in the display element layer DP-OLED. The connection electrode E-CNT may be electrically connected to the power source supply line E-VSS. The connection electrode E-CNT may extend from a top surface of the third insulating layer 30 to cover a top surface of the power source supply line E-VSS, which is exposed from the third insulating layer 30.

The second electrode E2 of the light emitting element ELD may extend from the display area DA into the peripheral area NDA so as to be connected to the connection electrode E-CNT. The connection electrode E-CNT may receive the second power source voltage from the power source supply line E-VSS. Thus, the second power source voltage may be provided to the pixels through the connection electrode E-CNT and the second electrode E2.

The connection electrode E-CNT may be located on the same layer as the first electrode E1 of the light emitting element ELD, and may be formed concurrently with the first electrode E1. However, embodiments of the present disclosure are not limited thereto. In another embodiment, the connection electrode E-CNT may be located on a layer different from a layer on which the first electrode E1 is located.

The driving signal line CL may be provided in plurality, and may be located on the second insulating layer 20. The driving signal line CL may be located in the peripheral area NDA. The driving signal line CL may be a routing line connected to a pad, or may be a line forming an integrated circuit (IC). The driving signal lines CL may be spaced apart from each other in the second direction DR2, and may transmit electrical signals independently of each other.

The initialization voltage line VIN may provide an initialization voltage to the pixel PX. In other embodiments, the initialization voltage line VIN may be provided in plurality, and the plurality of initialization voltage lines VIN may provide the initialization voltages to the pixels, respectively.

The driving signal line CL and the initialization voltage line VIN may be located on the same layer, and may be formed at the same time by the same process. However, embodiments of the present disclosure are not limited thereto. In another embodiment, the driving signal line CL and the initialization voltage line VIN may be formed independently of each other by different processes.

The dam portion DM1 and DM2 may be located in the peripheral area NDA. When the organic layer OL of the encapsulation layer TFE is formed, the dam portion DM1 and DM2 may prevent the organic layer OL from overflowing from the display area DA toward the outside of the dam portion DM1 and DM2 (e.g., from flowing in a direction opposite to the second direction DR2 in FIG. 3B). The dam portion DM1 and DM2 may be adjacent at least one side of the display area DA. In an embodiment, the dam portion DM1 and DM2 may surround the display area DA when viewed in a plan view. The dam portion DM1 and DM2 may include a first dam portion DM1 and a second dam portion DM2.

The first dam portion DM1 may be closer to the display area DA than the second dam portion DM2. In other words, the first dam portion DM1 may be located between the second dam portion DM2 and the display area DA. The first dam portion DM1 may overlap with the power source supply line E-VSS when viewed in a plan view. In the present embodiment, the connection electrode E-CNT may extend between the first dam portion DM1 and the power source supply line E-VSS when viewed in a cross-sectional view.

In the present embodiment, the first dam portion DM1 may include the same material as the fourth insulating layer 40, and may be formed concurrently with the fourth insulating layer 40 by using one mask. Thus, an additional process for forming the first dam portion DM1 may not be required. As a result, a process cost may be reduced, and processes may be simplified.

The second dam portion DM2 may be located outside the first dam portion DM1. The second dam portion DM2 may be located to cover a portion of the power source supply line E-VSS. In the present embodiment, the second dam portion DM2 may have a double layer structure including a first layer DM2-L1 and a second layer DM2-L2. For example, the first layer DM2-L1 may be formed concurrently with the third insulating layer 30, and the second layer DM2-L2 may be formed concurrently with the fourth insulating layer 40. Thus, the second dam portion DM2 may be easily formed without an additional process.

In the present embodiment, a portion of the connection electrode E-CNT may be located to overlap with a top surface of the first layer DM2-L1 of the second dam portion DM2. An end of the connection electrode E-CNT may be located between the first layer DM2-L1 and the second layer DM2-L2. However, embodiments of the present disclosure are not limited thereto. In another embodiment, the connection electrode E-CNT may not extend to the second dam portion DM2.

The first inorganic layer IOL1 and the second inorganic layer IOL2 may extend from the display area DA to the outside of the second dam portion DM2. The first inorganic layer IOL1 and the second inorganic layer IOL2 may cover the first dam portion DM1 and the second dam portion DM2. The organic layer OL may be located inside the second dam portion DM2 (e.g., past the second dam portion in the second direction DR2 in FIG. 3B). However, embodiments of the present disclosure are not limited thereto. In another embodiment, the organic layer OL may extend to an area overlapping with the first dam portion DM1.

Figure 4:
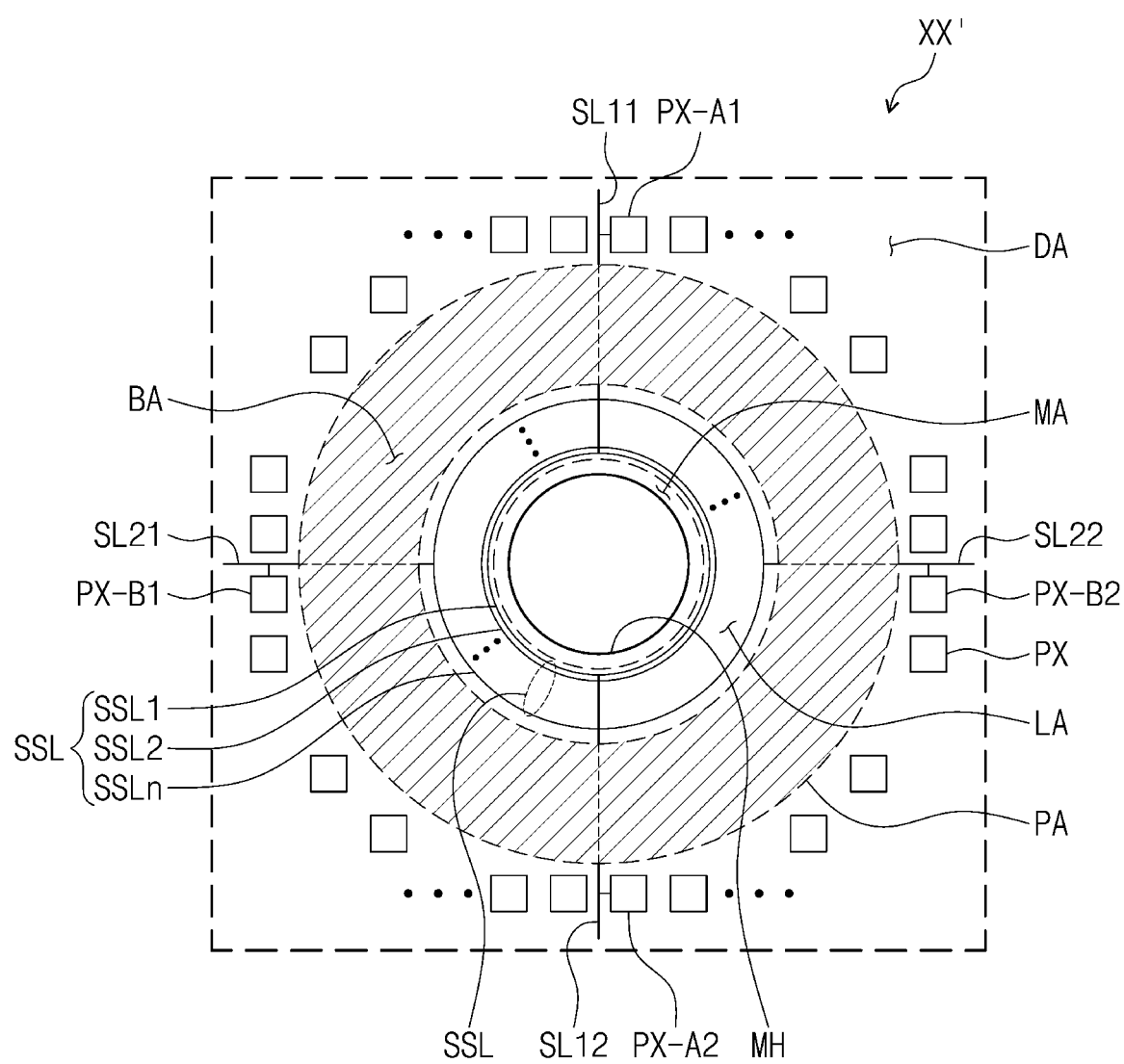
FIG. 4 is a plan view illustrating the area XX' of FIG. 2A.

FIG. 4 is a plan view illustrating the area XX' of FIG. 2A. FIG. 4 is an enlarged view of an area including the hole area PA. Hereinafter, an embodiment of the present disclosure will be described with reference to FIG. 4.

As illustrated in FIG. 4, the module hole MH may be formed in the hole area PA. The hole area PA may be surrounded by the display area DA when viewed in a plan view. Thus, the pixels PX may be arranged around the hole area PA. The hole area PA may include a margin area MA, a line area LA, and a compensation area BA. In FIG. 4, boundaries of the areas are illustrated as dotted lines for the purpose of ease and convenience in description and illustration.

The margin area MA may be an area that is not removed, but remains when the module hole MH is formed. Signal lines and/or electronic elements might not be located in the margin area MA. In other embodiments, a groove formed by recessing at least a portion of the insulating substrate BS (see FIG. 3B) may be located in the margin area MA. Because the display panel 100 includes the groove in the margin area MA, it is possible to block a path through which moisture or air (e.g., oxygen) provided through the module hole MH permeates into the display area DA.

The margin area MA may be adjacent to the module hole MH. The margin area MA may surround the module hole MH when viewed in a plan view. A size and/or a shape of the margin area MA may be changed depending on a size of the module hole MH and/or a position of the module hole MH. However, embodiments of the present disclosure are not limited thereto. In another embodiment, the margin area MA may be omitted.

The line area LA may be adjacent to the margin area MA. The line area LA may surround the module hole MH when viewed in a plan view. In the present embodiment, the line area LA may have a circle shape which is concentric with the margin area MA. However, embodiments of the present disclosure are not limited thereto. In other embodiments, the line area LA may have one of other various shapes surrounding the module hole MH in a plan view.

A plurality of signal lines SSL (hereinafter, referred to as sub-signal lines SSL) may be located in the line area LA. The sub-signal lines SSL may extend along at least a portion of an edge of the module hole MH. For example, each of the sub-signal lines SSL may have a closed-line (or closed-loop) shape surrounding the module hole MH in a plan view. In the present embodiment, each of the sub-signal lines SSL may have a circle shape.

The sub-signal lines SSL may be arranged to be spaced apart from each other in the line area LA. The sub-signal lines SSL may transmit signals independent of each other. For example, the sub-signal lines SSL may include at least one of a line for transmitting a gate signal, a line for transmitting a data signal, a line for transmitting an initialization voltage, a line for transmitting an emission control signal, or a line for transmitting a power source voltage.

The sub-signal lines SSL may include n lines which are sequentially arranged from the module hole MH and are spaced apart from each other. The n lines may be configured to transmit electrical signals provided to pixels located in rows and/or columns also occupied by the module hole MH. The sub-signal lines SSL may be electrically connected to main signal lines connected to the pixels adjacent to the module hole MH.

For the purpose of ease and convenience in description and illustration, a first sub-signal line SSL1, a second sub-signal line SSL2, and an $n^{th}$ sub-signal line SSLn among the sub-signal lines SSL are illustrated as an example in FIG. 4. The first sub-signal line SSL1 is closest to the module hole MH, the second sub-signal line SSL2 surrounds the first sub-signal line SSL1 in a plan view, and the $n^{th}$ sub-signal line SSLn is farthest from compensation area BA.

Each of the sub-signal lines SSL may be electrically connected to a corresponding one of the main signal lines connected to the pixels. In detail, the sub-signal lines SSL may be connected to the main signal lines connected to the pixels PX to transmit electrical signals to corresponding pixels.

The main signal lines may be located in the display area DA so as to be connected to corresponding ones of the pixels PX. A first main signal line SL11, a second main signal line SL12, a third main signal line SL21, and a fourth main signal line SL22 among the main signal lines are illustrated as an example in FIG. 4 for the purpose of ease and convenience in description and illustration.

The first main signal line SL11 may be a data line configured to provide a data signal to a first pixel PX-A1, and the second main signal line SL12 may be a data line configured to provide a data signal to a second pixel PX-A2. The third main signal line SL21 may be a gate line configured to provide a gate signal to a third pixel PX-B1, and the fourth main signal line SL22 may be a gate line configured to provide a gate signal to a fourth pixel PX-B2.

In the present embodiment, the first pixel PX-A1 and the second pixel PX-A2 may be spaced apart from each other with the hole area PA interposed therebetween, and may be located in the same column. The third pixel PX-B1 and the fourth pixel PX-B2 may be spaced apart from each other with the hole area PA interposed therebetween, and may be located in the same row.

In other embodiments, the main signal lines may further include an emission control line for transmitting an emission control signal to a pixel, and an initialization voltage line for providing an initialization voltage to a pixel. The main signal lines may be realized as various line shapes which are connected to the pixels PX located in the display area DA, and are configured to provide electrical signals for controlling the pixels PX, and the present disclosure is not limited to a specific embodiment.

In the present embodiment, connections between the main signal lines SL11, SL12, SL21, and SL22 and the sub-signal lines SSL are illustrated using dotted lines and full lines. The first main signal line SL11 and the second main signal line SL12 may be connected to the first sub-signal line SSL1, and the third main signal line SL21 and the fourth main signal line SL22 may be connected to the $n^{th}$ sub-signal line SSLn. Thus, the first and second main signal lines SL11 and SL12 may transmit substantially the same electrical signal, and the third and fourth main signal lines SL21 and SL22 may transmit substantially the same electrical signal.

In the present embodiment, the main signal line and the sub-signal line, which are connected to each other, may be located on the same layer. In addition, the main signal line and the sub-signal line may be formed as a single unitary body.

According to the present embodiment, the first main signal line SL11 and the second main signal line SL12 may be connected to each other through the first sub-signal line SSL1 to provide the same electrical signal to the first and second pixels PX-A1 and PX-A2 located in the same column and spaced apart from each other with the module hole MH interposed therebetween. Likewise, the third main signal line SL21 and the fourth main signal line SL22 may be connected to each other through the $n^{th}$ sub-signal line SSLn to provide the same electrical signal to the third and fourth pixels PX-B1 and PX-B2 located in the same row and spaced apart from each other with the module hole MH interposed therebetween. Thus, the pixels PX spaced apart from each other with the module hole MH interposed therebetween may be stably provided with an electrical signal without cutting of a signal line.

The compensation area BA may be adjacent to the line area LA. The compensation area BA may be defined between the line area LA and the display area DA when viewed in a plan view. In an embodiment, the compensation area BA may display a black color (e.g. a dark color, or a low grayscale color) by an electrical signal.

For example, the compensation area BA may block incident light to realize the black color. For another example, the compensation area BA may generate and display light of a low gray scale, which shows a substantially black color.

Because the sub-signal lines SSL are densely provided in the line area LA as described above, the line area LA may show the black color. Because the compensation area BA shows the black color, the compensation area BA may be viewed as an area having continuity from the line area LA.

According to the present embodiment, an area adjacent to the module hole MH may further include the compensation area BA displaying the black color, and thus a defect (e.g., a spot) which may occur in the area adjacent to the module hole MH may not be visible to the outside.

In addition, according to the present embodiment, the compensation area BA may be located between the line area LA and the display area DA, and thus it is possible to prevent the sub-signal lines SSL densely provided in the line area LA from electrically affecting the pixels PX. As a result, an image distortion phenomenon around the module hole MH may be reduced or prevented, and display quality may be uniformly maintained in the whole of the display area DA.

Figure 5A:
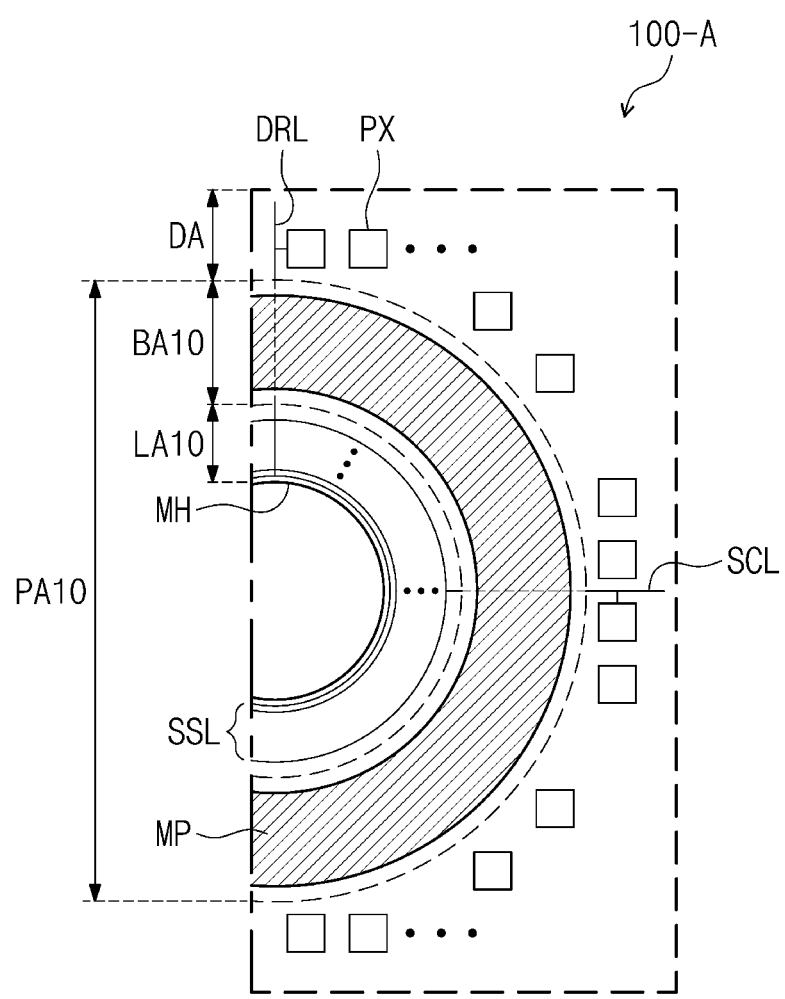
FIG. 5A is a plan view illustrating a portion of a display panel according to an embodiment of the present disclosure.
Figure 5B:
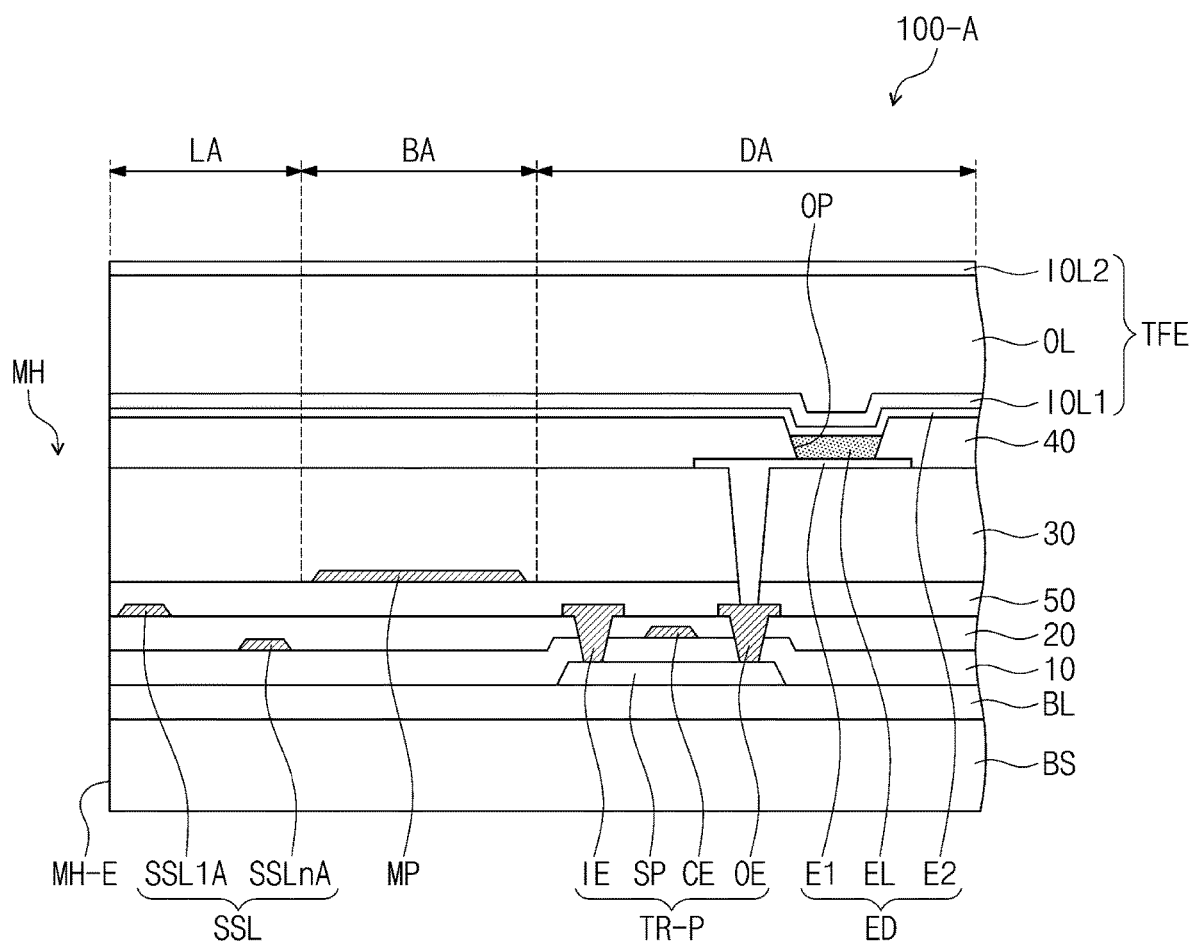
FIG. 5B is a cross-sectional view schematically illustrating a partial area of FIG. 5A.

FIG. 5A is a plan view illustrating a portion of a display panel according to an embodiment of the present disclosure. FIG. 5B is a cross-sectional view schematically illustrating a partial area of FIG. 5A. FIG. 5A illustrates an area corresponding to a portion of the area of FIG. 4 for the purpose of ease and convenience in description and illustration. Hereinafter, an embodiment of the present disclosure will be described in detail with reference to FIGS. 5A and 5B. In the present embodiment, the same components as described with reference to FIGS. 1 to 4 will be indicated by the same reference numerals or designators, and the descriptions thereto will be omitted or mentioned briefly.

A display panel 100-A of FIGS. 5A and 5B may include a hole area PA10. The hole area PA10 may correspond to an area obtained by omitting the margin area MA from the hole area PA of FIG. 4. Thus, the hole area PA10 may include a line area LA and a compensation area BA, and the line area LA of the hole area PA10 may be directly adjacent the module hole MH.

FIG. 5B illustrates a cross-sectional view of an area in which the module hole MH is defined. As illustrated in FIG. 5B, the module hole MH may penetrate the display panel 100-A. Thus, the insulating substrate BS, the base layer BL, and the first to fourth insulating layers 10, 20, 30, and 40 may form an edge MH-E defining an inner surface of the module hole MH.

The display panel 100-A according to the present embodiment may include a metal pattern MP located in the compensation area BA. The metal pattern MP may be spaced apart from sub-signal lines SSL and pixels PX when viewed in a plan view.

The metal pattern MP may cover at least a portion of the compensation area BA. In an embodiment, the metal pattern MP may cover most of the compensation area BA. For example, the metal pattern MP may have a concentric circle shape which is substantially the same as that of the compensation area BA.

The metal pattern MP may include an optically opaque material. The metal pattern MP may block incident light. Thus, the compensation area BA may show a black color.

A first sub-signal line SSL1A and an $n^{th}$ sub-signal line SSLnA among the sub-signal lines SSL are illustrated as an example in FIG. 5B for the purpose of ease and convenience in description and illustration. The first sub-signal line SSL1A may be connected to a data line, and the $n^{th}$ sub-signal line SSLnA (hereinafter, referred to as a second sub-signal line) may be connected to a gate line. In the present embodiment, the first sub-signal line SSL1A and the second sub-signal line SSLnA may be located on different layers, respectively. For example, the first sub-signal line SSL1A may be located between the second insulating layer 20 and the third insulating layer 30, and may be located on the same layer as the input and output electrodes IE and OE of the pixel transistor TR-P. The second sub-signal line SSLnA may be located between the first insulating layer 10 and the second insulating layer 20, and may be located on the same layer as the control electrode CE of the pixel transistor TR-P.

Meanwhile, in the present embodiment, the display panel 100-A may further include a fifth insulating layer 50 located between the second insulating layer 20 and the third insulating layer 30. Thus, the first electrode E1 of the light emitting element ELD may penetrate the third and fifth insulating layers 30 and 50 so as to be connected to the pixel transistor TR-P. In addition, the first sub-signal line SSL1A may be located between the second insulating layer 20 and the fifth insulating layer 50.

The metal pattern MP may be located on a layer different from the layers on which the first sub-signal line SSL1A and the second sub-signal line SSLnA are located. For example, the metal pattern MP may be located between the fifth insulating layer 50 and the third insulating layer 30.

In the present embodiment, main signal lines DRL and SCL may extend from the display area DA so as to be connected to the sub-signal lines SSL. Each of the first and second sub-signal lines SSL1A and SSLnA may be integrally formed with a corresponding one of the main signal lines DRL and SCL as a single unitary body. The main signal lines DRL and SCL may extend through the compensation area BA to electrically connect the line area LA and the display area DA. Thus, the metal pattern MP may overlap with the main signal lines DRL and SCL when viewed in a plan view.

According to the present embodiment, the metal pattern MP may be located on a layer that is different from the layers on which the first and second sub-signal lines SSL1A and SSLnA are located, and thus the metal pattern MP may be electrically insulated from the main signal lines DRL and SCL respectively connected to the first and second sub-signal lines SSL1A and SSLnA. As a result, because the metal pattern MP is not electrically connected to the main signal lines DRL and SCL even though it is located in the compensation area BA, electrical connection between the line area LA and the display area DA may be stably maintained.

The metal pattern MP may be in an electrically floating state. In other words, the metal pattern MP may have a concentric circle shape surrounding the module hole MH.

Alternatively, the metal pattern MP may receive an electrical signal (e.g., a predetermined electrical signal). For example, the metal pattern MP may be connected to a direct current (DC) line for providing a power source voltage or an initialization voltage, or may be connected to an alternating current (AC) line for providing a data voltage or a gate voltage. For example, the metal pattern MP may receive the same voltage as one of the sub-signal lines SSL. For example, in other embodiments, the metal pattern MP may be connected to a power source line to receive a ground voltage.

Alternatively, the metal pattern MP may be connected to a gate line or a data line of a pixel closest to the metal pattern MP. In this case, the metal pattern MP may include a plurality of metal patterns spaced apart from each other, and the number of the metal patterns may be equal to the number of the pixels adjacent thereto. Thus, the pixels closest to the metal pattern MP may not be affected by other signals that are other than signals provided to signal lines connected to the closest pixels.

According to the present embodiment, because the metal pattern MP is maintained at a voltage (e.g., a predetermined voltage), electrical interference between the line area LA and the display area DA may be blocked. As a result, electrical coupling between the sub-signal lines SSL of the line area LA and the pixels adjacent thereto may be reduced or solved, and thus the pixels located around the module hole MH may be stably driven.

Figure 6A:
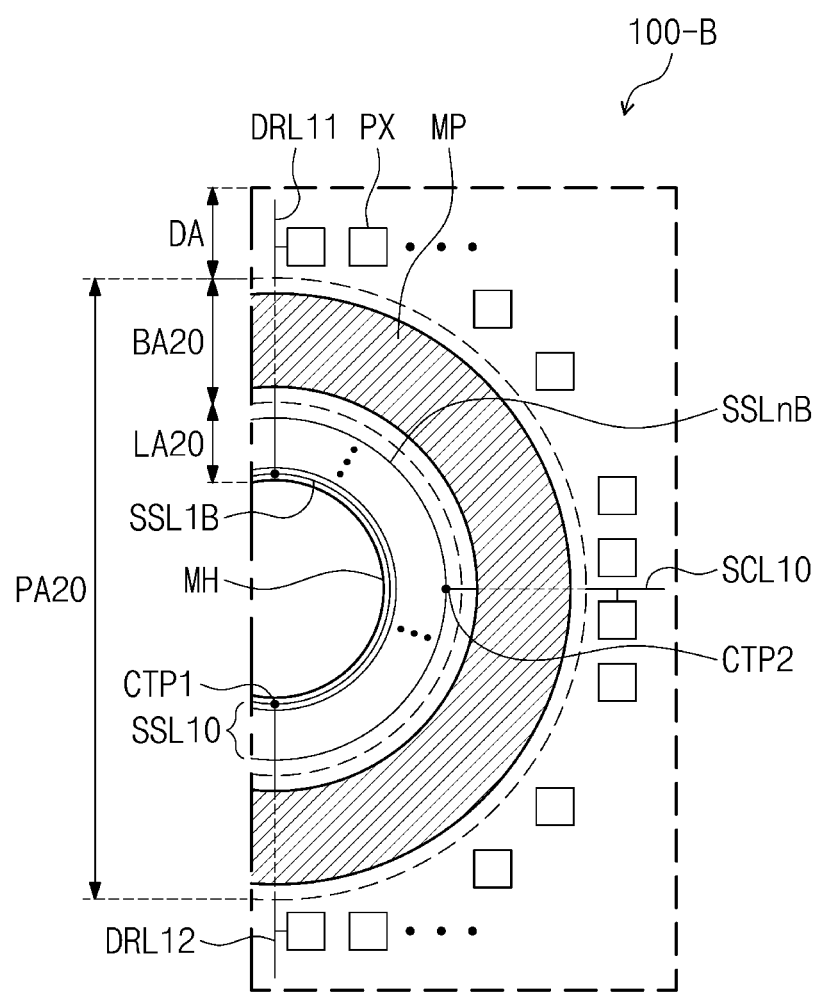
FIG. 6A is a plan view illustrating a portion of a display panel according to an embodiment of the present disclosure.
Figure 6B:
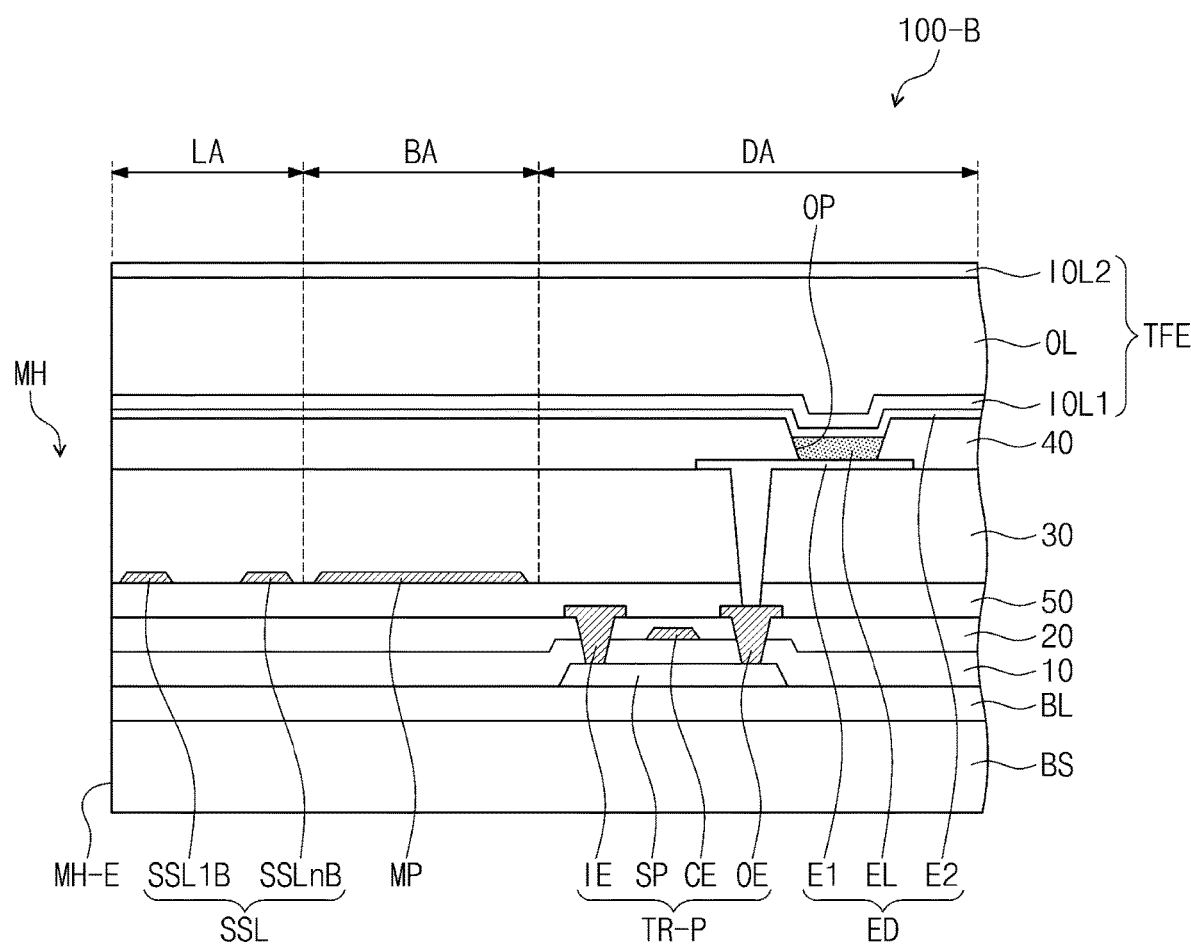
FIG. 6B is a cross-sectional view schematically illustrating a partial area of FIG. 6A.

FIG. 6A is a plan view illustrating a portion of a display panel according to an embodiment of the present disclosure. FIG. 6B is a cross-sectional view schematically illustrating a partial area of FIG. 6A. For the purpose of ease and convenience in description and illustration, FIG. 6A illustrates an area corresponding to FIG. 5A and FIG. 6B illustrates an area corresponding to FIG. 5B. Hereinafter, an embodiment of the present disclosure will be described in detail with reference to FIGS. 6A and 6B. In the present embodiment, the same components as described with reference to FIGS. 1 to 5B will be indicated by the same reference numerals or designators, and the descriptions thereto will be omitted.

A display panel 100-B according to the present embodiment may include the hole area PA10 in which the module hole MH is located, and the display area DA surrounding the hole area PA10. Main signal lines DRL11, DRL12 and SCL10 may extend from the display area DA and may intersect or cross the compensation area BA so as to be connected to sub-signal lines SSL10.

A first main signal line DRL11, a second main signal line DRL12, and a third main signal line SCL10 of the main signal lines are illustrated as an example in FIG. 6A for the purpose of ease and convenience in description. The first main signal line DRL11 (hereinafter, referred to as a first data line) and the second main signal line DRL12 (hereinafter, referred to as a second data line) may be connected to a first sub-signal line SSL1B, and the third main signal line SCL10 (hereinafter, referred to as a gate line) may be connected to a second sub-signal line SSLnB.

In the present embodiment, the sub-signal lines SSL10 may be located on a layer that is different from a layer on which the main signal lines DRL11, DRL12 and SCL10 are located. In an embodiment, the first sub-signal line SSL1B may be located on a layer that is different from a layer on which the input and output electrodes IE and OE of the pixel transistor TR-P of the display area DA are located. The second sub-signal line SSLnB may be located on a layer different from a layer on which the control electrode CE of the pixel transistor TR-P of the display area DA is located.

Thus, the display panel 100-B may further include contact portions CTP1 and CTP2 located in the hole area PA10. A first contact portion CTP1 of the contact portions may connect the first sub-signal line SSL1B to each of the data lines DRL11 and DRL12, and a second contact portion CTP2 of the contact portions may connect the second sub-signal line SSLnB to the gate line SCL10. In other embodiments, the first contact portion CTP1 may penetrate the fifth insulating layer 50 to connect each of the data lines DRL11 and DRL12 to the first sub-signal line SSL1B, and the second contact portion CTP2 may penetrate the second and fifth insulating layers 20 and 50 to connect the gate line SCL10 to the second sub-signal line SSLnB. According to the present embodiment, because the display panel 100-B further includes the contact portions CTP1 and CTP2, the sub-signal lines SSL10 may be formed on the same layer at the same time. Thus, processes may be simplified.

In the present embodiment, the metal pattern MP may be located on the same layer as the sub-signal lines SSL10. The metal pattern MP may be spaced apart from the sub-signal lines SSL10 in a plan view, and may be electrically insulated from the sub-signal lines SSL10. The main signal lines DRL11, DRL12 and SCL10 may be connected to the sub-signal lines SSL10 through the contact portions CTP1 and CTP2, and thus the main signal lines DRL11, DRL12 and SCL10 may overlap with the metal pattern MP while not being in contact with the metal pattern MP, even though they extend through the compensation area BA. As a result, the line area LA may be stably connected to the display area DA through the contact portions CTP1 and CTP2 regardless of an area occupied by the metal pattern MP in the compensation area BA.

Figure 7A:
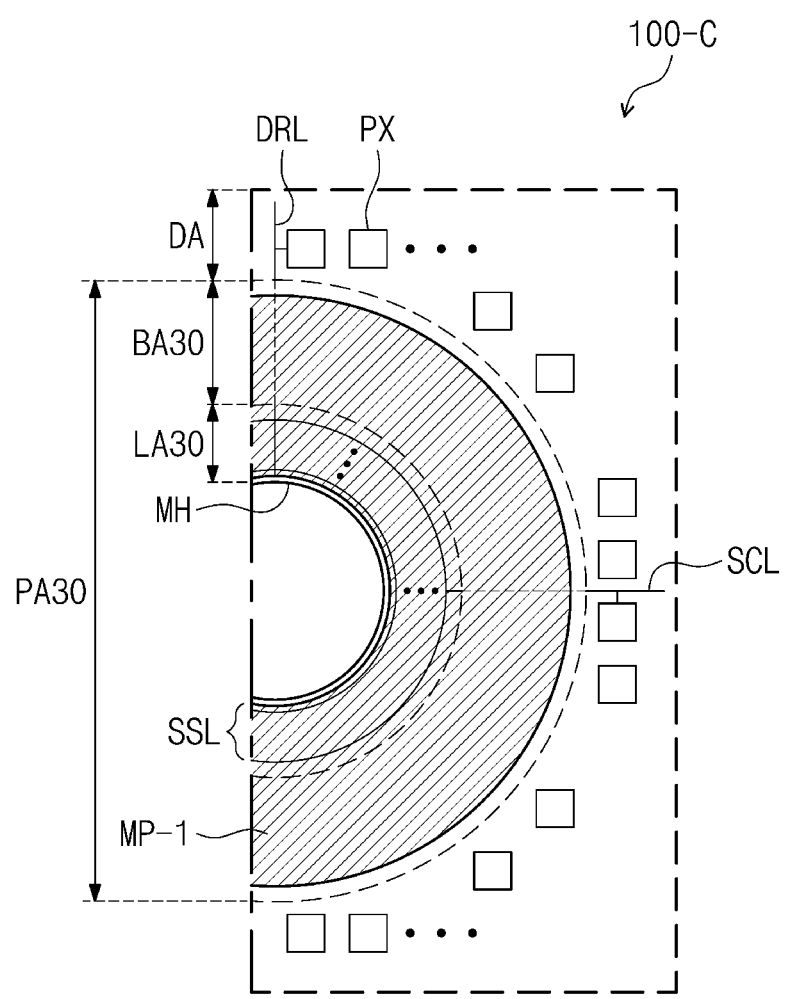
FIG. 7A is a plan view illustrating a portion of a display panel according to an embodiment of the present disclosure.
Figure 7B:
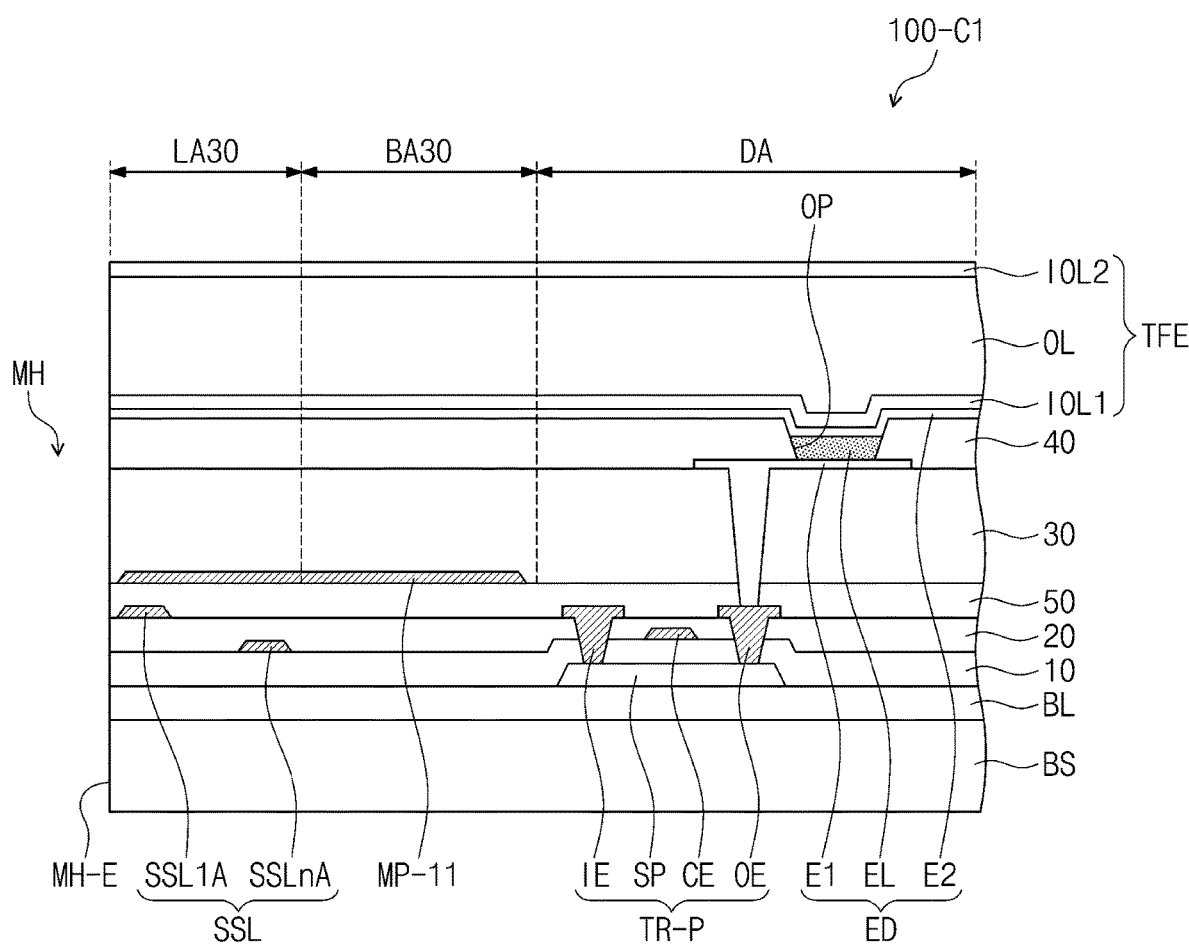
FIGS. 7B to 7D are cross-sectional views schematically illustrating a partial area of FIG. 7A.
Figure 7C:
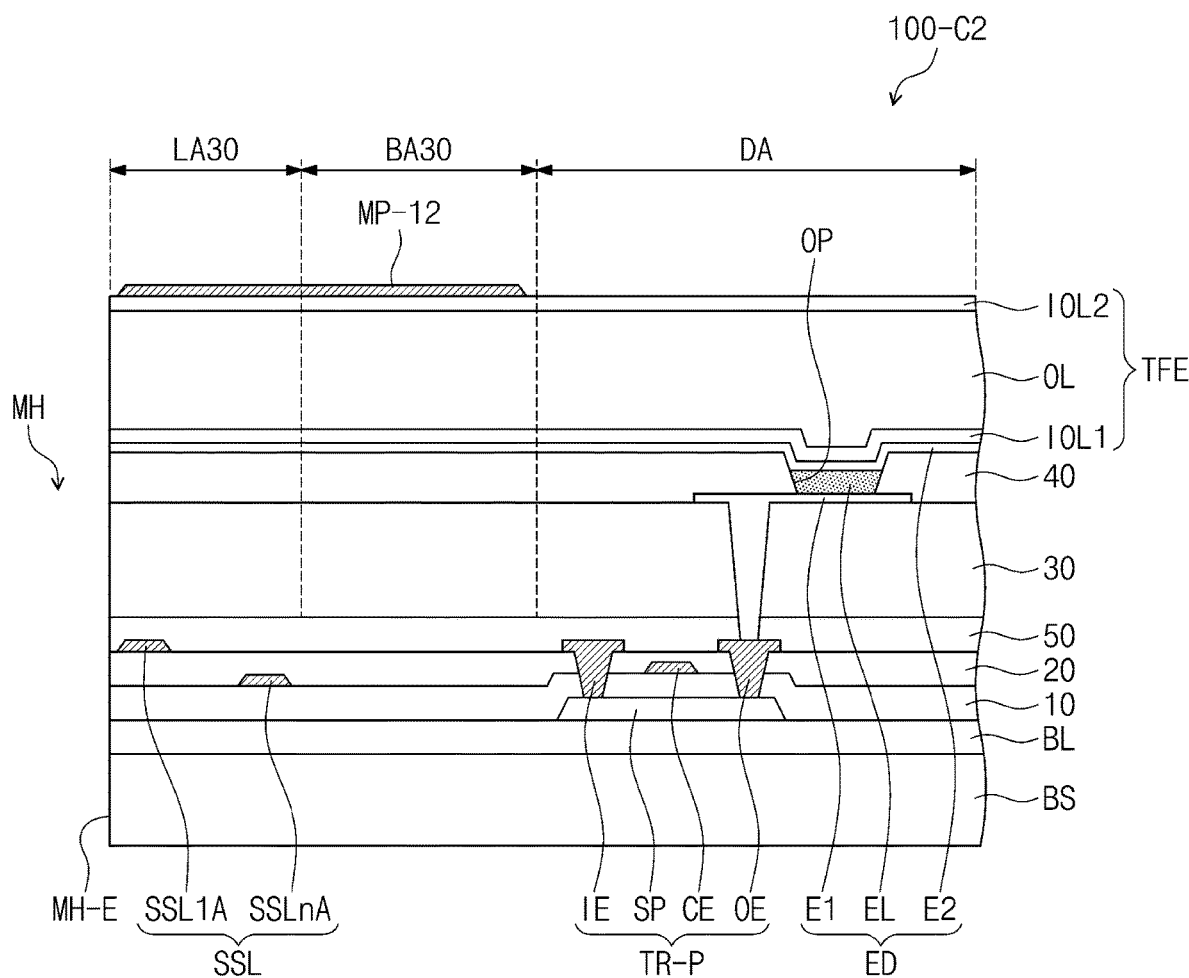
Figure 7D:
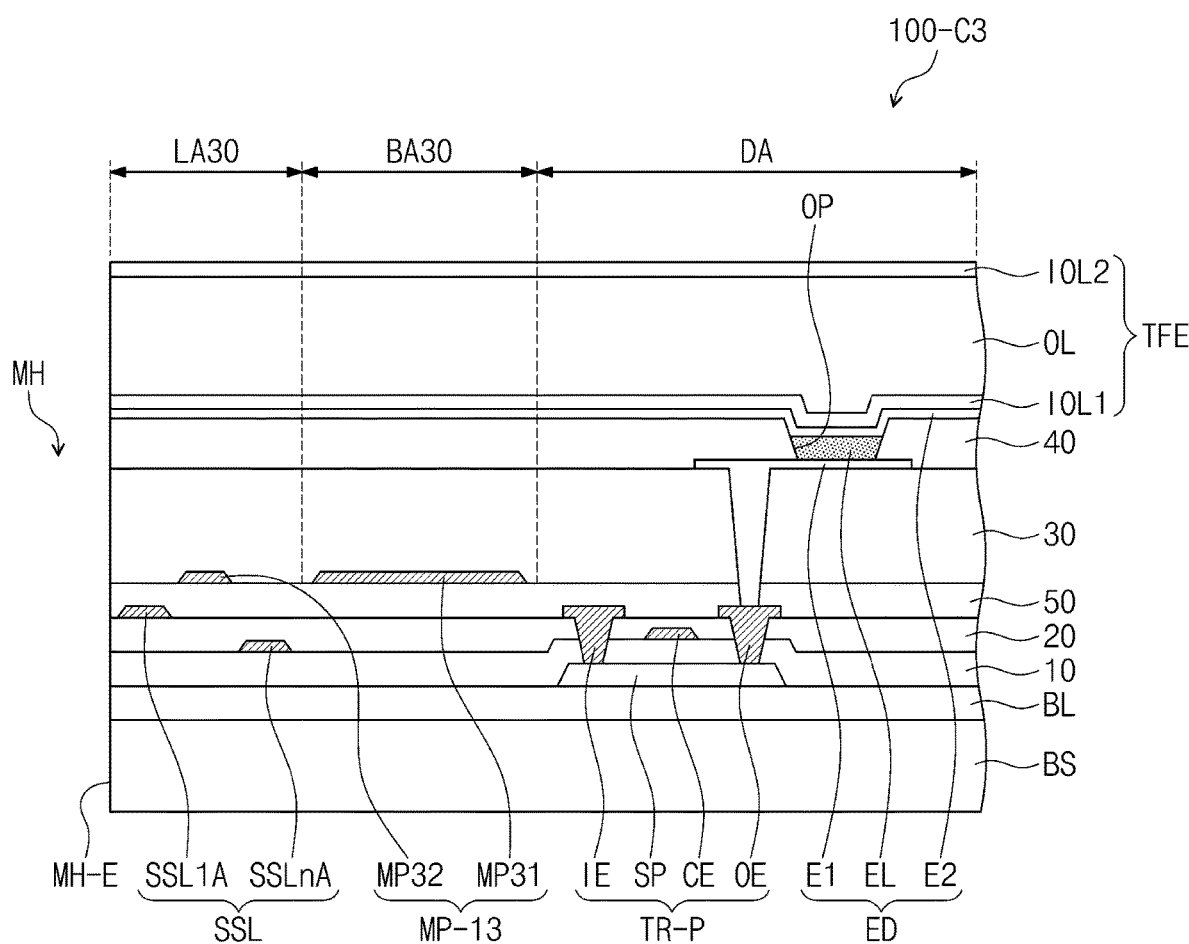

FIG. 7A is a plan view illustrating a portion of a display panel according to an embodiment of the present disclosure. FIGS. 7B to 7D are cross-sectional views schematically illustrating a partial area of FIG. 7A. For the purpose of ease and convenience in description and illustration, FIG. 7A illustrates an area corresponding to FIG. 5A, and FIGS. 7B to 7D illustrate areas corresponding to FIG. 5B. Hereinafter, some embodiments of the present disclosure will be described in detail with reference to FIGS. 7A to 7D. In the present embodiments, the same components as described with reference to FIGS. 1 to 6B will be indicated by the same reference numerals or designators, and the repeated descriptions thereto will be omitted.

As illustrated in FIG. 7A, a metal pattern MP-1 may extend into a line area LA30 in a display panel 100-C according to an embodiment of the present disclosure. The metal pattern MP-1 may have an area and a shape that overlap with both a compensation area BA30 and the line area LA30. The metal pattern MP-1 may overlap with the sub-signal lines SSL when viewed in a plan view.

As illustrated in FIG. 7B, in a display panel 100-C1, a metal pattern MP-11 may be on a layer that is different from layers on which the sub-signal lines SSL are located. The sub-signal lines SSL may be located under the fifth insulating layer 50, and the metal pattern MP-11 may be located on the fifth insulating layer 50. The metal pattern MP-11 may be spaced apart from the sub-signal lines SSL with the fifth insulating layer 50 interposed therebetween, and thus the metal pattern MP-11 may be electrically insulated from the sub-signal lines SSL even though it overlaps with the sub-signal lines SSL when viewed in a plan view.

Alternatively, as illustrated in FIG. 7C, a metal pattern MP-12 may be located on the encapsulation layer TFE in a display panel 100-C2. The metal pattern MP-12 may be located on the second inorganic layer IOL2, and may overlap with the compensation area BA30 and the line area LA30. The metal pattern MP-12 may be spaced apart from the sub-signal lines SSL with a plurality of the insulating layers 30, 40, 50 and the encapsulation layer TFE interposed therebetween, and thus the metal pattern MP-12 may be electrically insulated from the sub-signal lines SSL even though it overlaps with the sub-signal lines SSL when viewed in a plan view.

Alternatively, as illustrated in FIG. 7D, a metal pattern MP-13 may further include a metal pattern MP32 located in the line area LA30, in a display panel 100-C3. In other words, the metal pattern MP-13 may include a metal pattern MP31 (hereinafter, referred to as a first pattern) in the compensation area BA30, and the metal pattern MP32 (hereinafter, referred to as a second pattern) in the line area LA30. The first pattern MP31 located at a position corresponding to the position of the metal pattern MP of FIG. 6B is illustrated as an example.

The second pattern MP32 may be located in the line area LA30. The second pattern MP32 may be spaced apart from the sub-signal lines SSL when viewed in a plan view. In other words, the second pattern MP32 might not overlap with the sub-signal lines SSL when viewed in a plan view. In the present embodiment, the second pattern MP32 may be on the same layer (e.g., the fifth insulating layer 50) as the first pattern MP31. However, embodiments of the present disclosure are not limited thereto. In another embodiment, the second pattern MP32 may be on the same layer as one of the sub-signal lines SSL.

The second pattern MP32 may be provided in plurality, and the second patterns MP32 may be located in spaces between the sub-signal lines SSL, respectively, when viewed in a plan view. The second pattern MP32 and the sub-signal lines SSL may reduce an empty space in the line area LA30, and thus an entire line area LA30 may have a substantially uniform light blocking property.

Referring to FIGS. 7A to 7D, the area in which the metal pattern MP-1, MP-11, MP-12 or MP-13 is located may extend from the compensation area BA30 into the line area LA30, and thus, substantially the same light blocking area may be formed in the line area LA30 and the compensation area BA30. Because the metal pattern MP-1, MP-11, MP-12 or MP-13 is located in both the line area LA30 and the compensation area BA30, the compensation area BA30 and the line area LA30 may be visible as the same black color. As a result, the metal pattern MP-1, MP-11, MP-12 or MP-13 may cover the sub-signal lines SSL to inhibit or prevent visibility of any defect in the line area LA30, which may be caused by external light reflection of the sub-signal lines SSL. In addition, the same metal pattern MP-1, MP-11, MP-12 or MP-13 may be provided in the compensation area BA30 and the line area LA30, and thus the compensation area BA30 and the line area LA30 may be designed to be visible as substantially the same black color. As a result, the light blocking property may be uniform in the hole area PA30.

Figure 8:
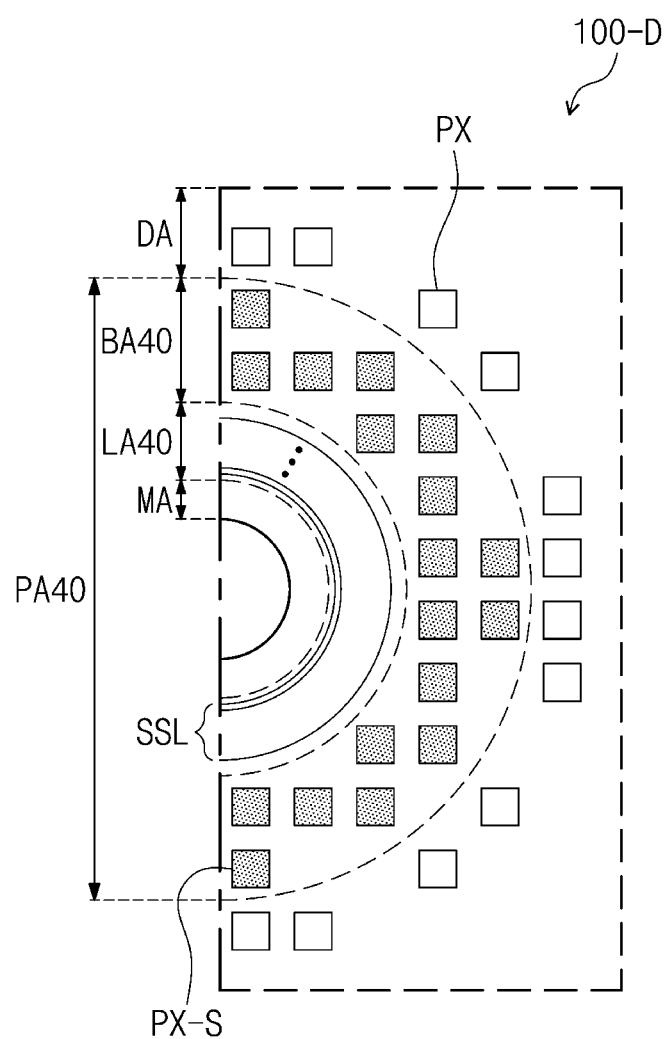
FIG. 8 is a plan view illustrating a portion of a display panel according to an embodiment of the present disclosure.

FIG. 8 is a plan view illustrating a portion of a display panel according to an embodiment of the present disclosure. FIGS. 9A to 9G are cross-sectional views illustrating portions of display panels according to some embodiments of the present disclosure, respectively. FIGS. 9A to 9G illustrate cross-sectional views of areas corresponding to a compensation area BA40. Hereinafter, some embodiments of the present disclosure will be described with reference to FIGS. 8 and 9A to 9G. In the present embodiments, the same components as described with reference to FIGS. 1 to 7D will be indicated by the same reference numerals or designators, and the descriptions thereto will be omitted.

As illustrated in FIG. 8, in a display panel 100-D, a hole area PA40 may include a compensation area BA40, a line area LA40, and a margin area MA. Here, the display panel 100-D may further include a plurality of compensation pixels PX-S located in the hole area PA40. The compensation pixels PX-S may be arranged in the compensation area BA40. The arrangement of the compensation pixels PX-S may be continuous with arrangement of the pixels PX located in the display area DA. Each of the compensation pixels PX-S may display a black color. FIGS. 9A to 9G illustrate examples of one of the compensation pixels PX-S.

Figure 9A:
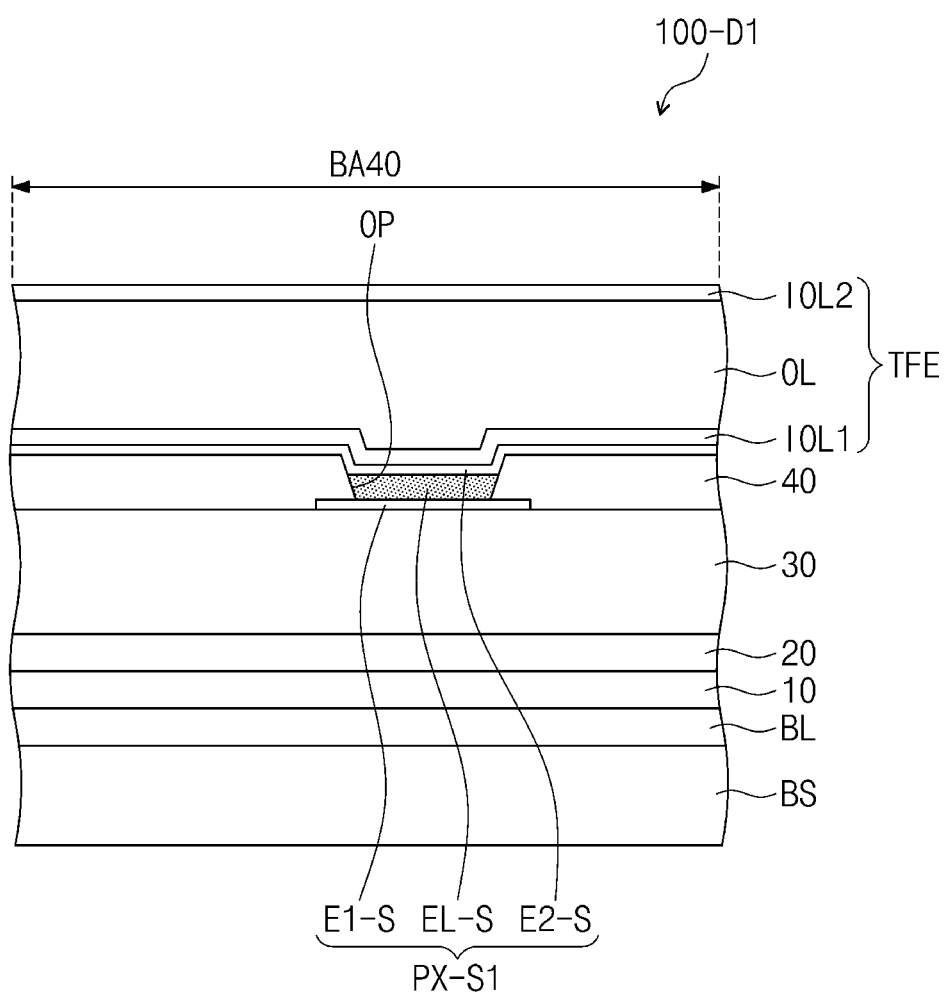
FIGS. 9A to 9G are cross-sectional views illustrating portions of display panels according to some embodiments of the present disclosure, respectively.

As illustrated in FIG. 9A, a display panel 100-D1 may include a compensation pixel PX-S1 located in a compensation area BA40. The compensation pixel PX-S1 may include a first electrode E1-S, a second electrode E2-S, and an emission layer EL-S. The compensation pixel PX-S1 may have the same structure as the light emitting element ELD (see FIG. 3B) located in the display area DA. The first electrode E1-S, the emission layer EL-S and the second electrode E2-S may be formed concurrently with the first electrode E1, the emission layer EL and the second electrode E2 of the light emitting element ELD of the display area DA by the same processes, respectively. Thus, the compensation pixel PX-S1 may be formed without an additional process, and thus processes may be simplified and a process cost may be reduced.

According to the present embodiment, the compensation pixel PX-S1 may have the structure which is the same as some of the components of the pixel PX (see FIG. 3B) located in the display area DA (see FIG. 3B). For example, the compensation pixel PX-S1 may correspond to a floating light emitting element. In detail, the compensation pixel PX-S1 may include the first electrode E1-S, the second electrode E2-S, and the emission layer EL-S, and the first electrode E1-S might not be connected to the transistor TR (see FIG. 3B) but may be floated. In other words, the compensation pixel PX-S1 might not be connected to the main signal line or the sub-signal line, unlike the pixel PX of the display area DA. The first electrode E1-S of the compensation pixel PX-S1 might not be connected to a thin film transistor or a signal line, and thus the first electrode E1-S may not receive an electrical signal. As a result, the compensation pixel PX-S1 may not generate light, and thus may be shown as a substantially black color. However, embodiments of the present disclosure are not limited thereto. In other embodiments, the compensation pixel PX-S1 may have a structure that does not include the light emitting element, but includes the pixel transistor or the capacitor of the pixel PX.

Figure 9B:
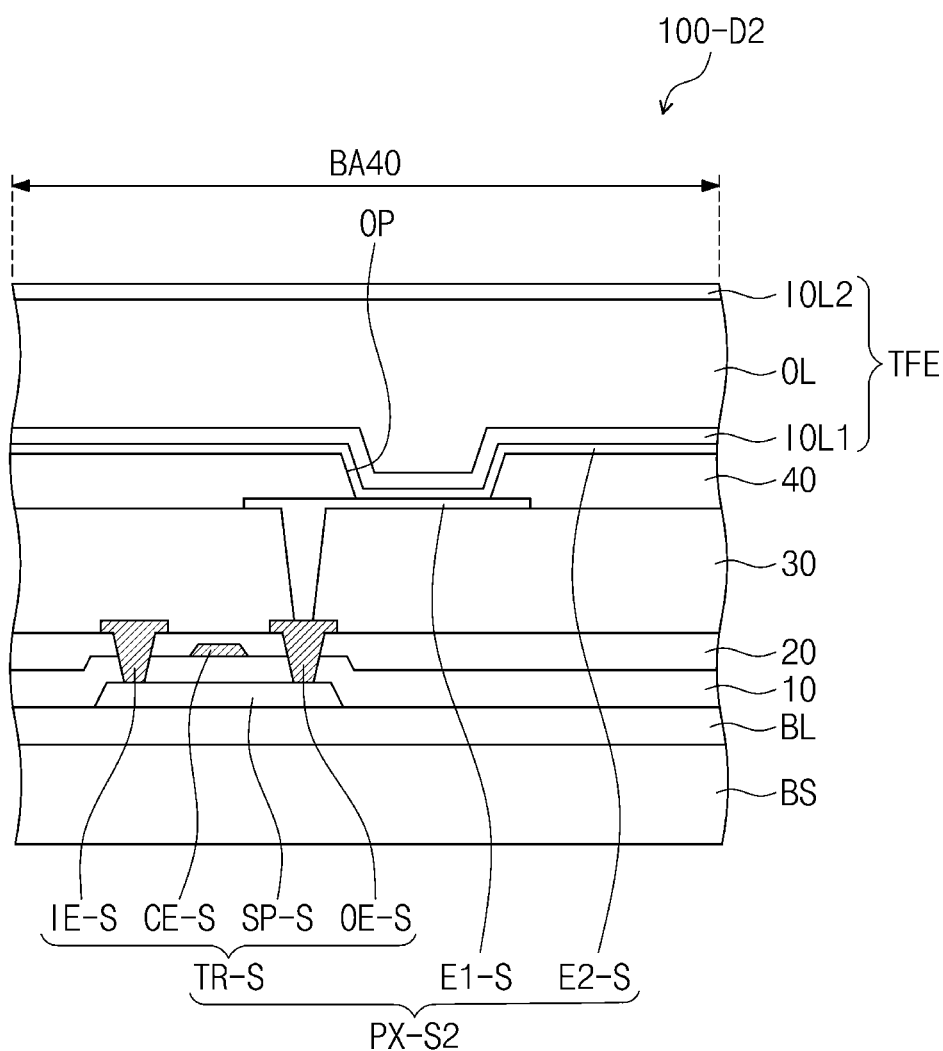

In another embodiment, as illustrated in a display panel 100-D2 of FIG. 9B, a compensation pixel PX-S2 may have a structure that does not include the emission layer EL (see FIG. 3B) of the components of the pixel PX of the display area DA. Thus, the compensation pixel PX-S2 may include a thin film transistor TR-S, the first electrode E1-S, and the second electrode E2-S. The thin film transistor TR-S may include a semiconductor pattern SP-S, a control electrode CE-S, an input electrode IE-S, and an output electrode OE-S. The thin film transistor TR-S may have a structure corresponding to that of the pixel transistor TR-P located in the display area DA.

The second electrode E2-S may be located directly on the first electrode E1-S. Because the emission layer EL (see FIG. 3B) that is capable of emitting light by a voltage difference is omitted in the compensation pixel PX-S2, the compensation pixel PX-S2 may not generate light. Thus, the compensation pixel PX-S2 may be shown as a substantially black color.

Figure 9C:
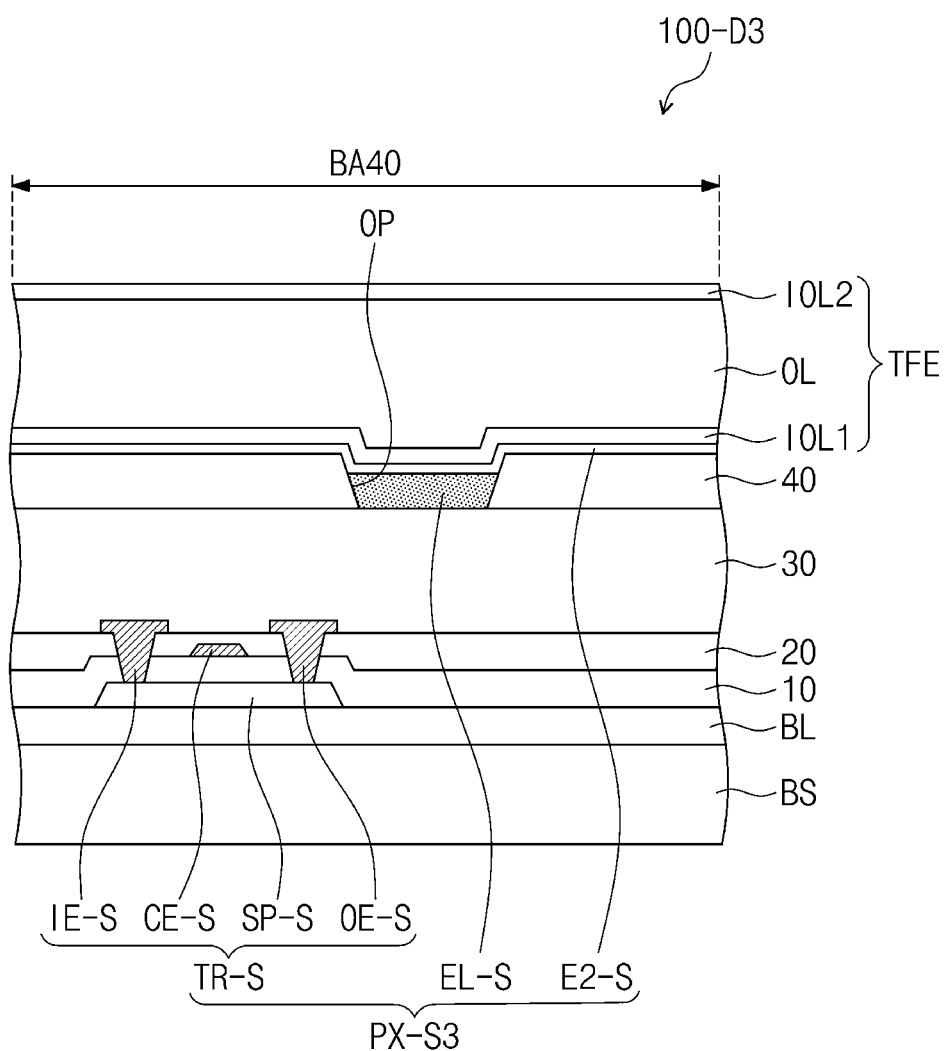

In another embodiment, as illustrated in a display panel 100-D3 of FIG. 9C, a compensation pixel PX-S3 may have a structure that does not include the first electrode E1 of the components of the pixel PX located in the display area DA. Thus, the compensation pixel PX-S3 may include the thin film transistor TR-S, the emission layer EL-S, and the second electrode E2-S. Because one of two electrodes located with the emission layer EL-S interposed therebetween to generate a voltage difference is omitted, a voltage for emitting light may not be applied to the emission layer EL-S. Thus, the compensation pixel PX-S3 may be shown as a substantially black color. Alternatively, the compensation pixel PX-S3 may have a structure that does not include the second electrode E2 of the components of the pixel PX.

Figure 9D:
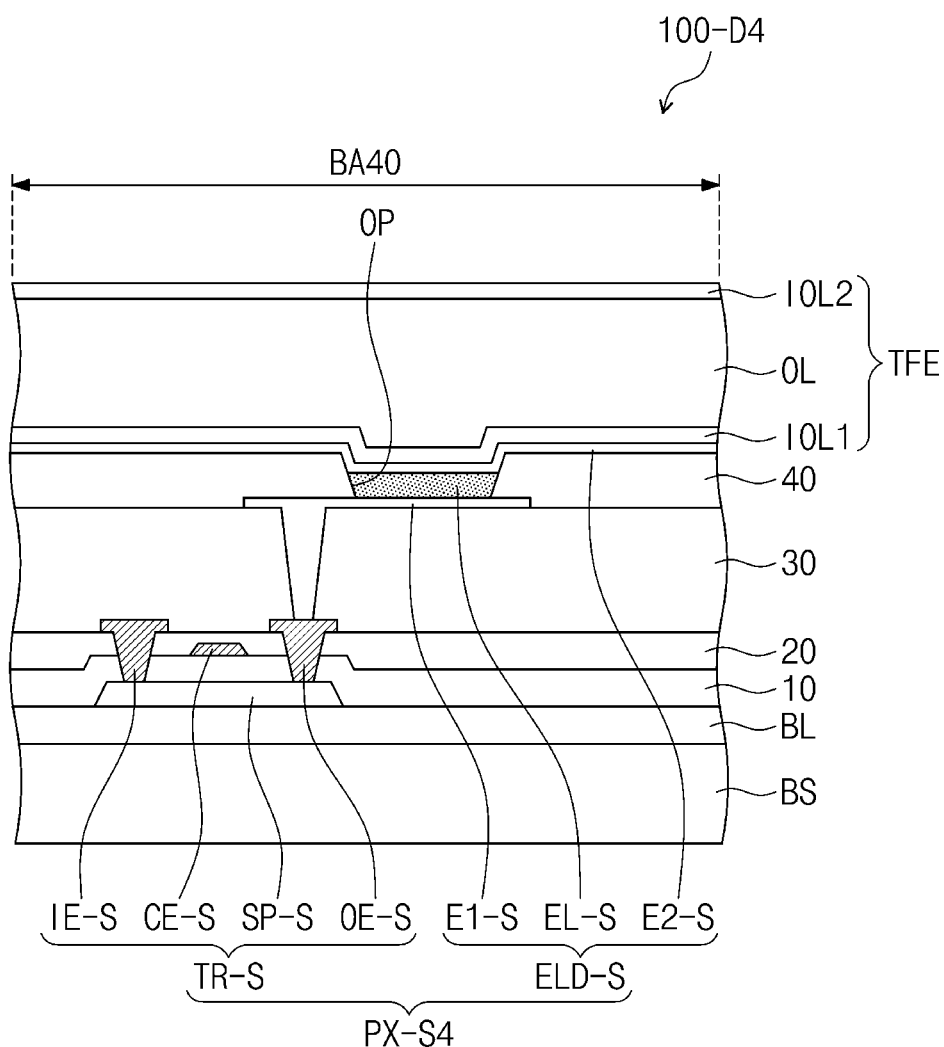

In another embodiment, as illustrated in FIG. 9D, a display panel 100-D4 may include a compensation pixel PX-S4 located in the compensation area BA40. The compensation pixel PX-S4 may include the thin film transistor TR-S and a light emitting element ELD-S. The light emitting element ELD-S may include the first electrode E1-S, the second electrode E2-S, and the emission layer EL-S.

The compensation pixel PX-S4 may have a structure corresponding to that of the pixel PX located in the display area DA. Thus, the thin film transistor TR-S may have a structure corresponding to that of the pixel transistor TR-P located in the display area DA, and the light emitting element ELD-S may have a structure corresponding to that of the light emitting element ELD located in the display area DA. Accordingly, the compensation pixel PX-S4 and the pixel PX located in the display area DA may be formed by the same processes. As a result, processes may be simplified and a process cost may be reduced.

The compensation pixel PX-S4 may display light having a color of a low gray scale. The light having the color of the low gray scale may be shown as a black color to a user. Thus, when the image IM (see FIG. 1) is displayed in the display area DA, a black image may be displayed in the hole area PA40.

Figure 9E:
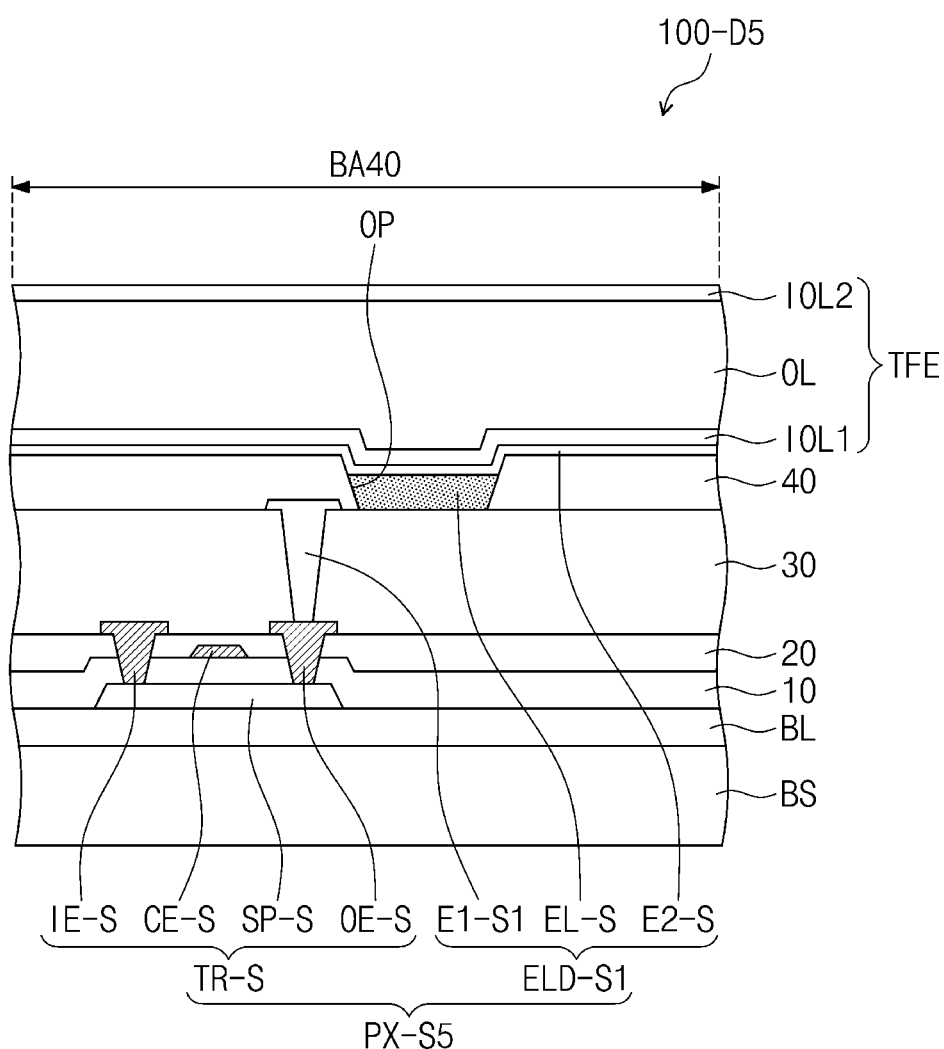

Alternatively, as illustrated in FIG. 9E, a display panel 100-D5 may include a compensation pixel PX-S5 including a compensation light emitting element ELD-S1. The compensation pixel PX-S5 may include the thin film transistor TR-S and the compensation light emitting element ELD-S1. The thin film transistor TR-S may correspond to the thin film transistor TR-S of FIG. 9D.

A first electrode E1-S1 of the compensation light emitting element ELD-S1 may have a different shape from that of the first electrode E1-S of the light emitting element ELD-S of FIG. 9D. For example, the first electrode E1-S1 may have an area that is less than that of the first electrode E1-S of FIG. 9D, and might not overlap with the emission layer EL-S in a plan view.

Thus, even though the compensation light emitting element ELD-S1 includes the first electrode E1-S1 connected to the thin film transistor TR-S and the emission layer EL-S provided in the opening OP, it ELD-S1 may not emit light by the non-overlapping structure of the emission layer EL-S and the first electrode E1-S1. As a result, the compensation area BA40 may be shown as a substantially black color by the compensation pixel PX-S5 including the compensation light emitting element ELD-S1.

According to the present disclosure, the compensation pixel PX-S5 may be formed using general processes (e.g., processes of forming the light emitting element ELD of the display area DA) by changing the area of the first electrode E1-S1 in the compensation area BA40. Thus, a process design may be simplified, and a process cost may be reduced.

Figure 9F:
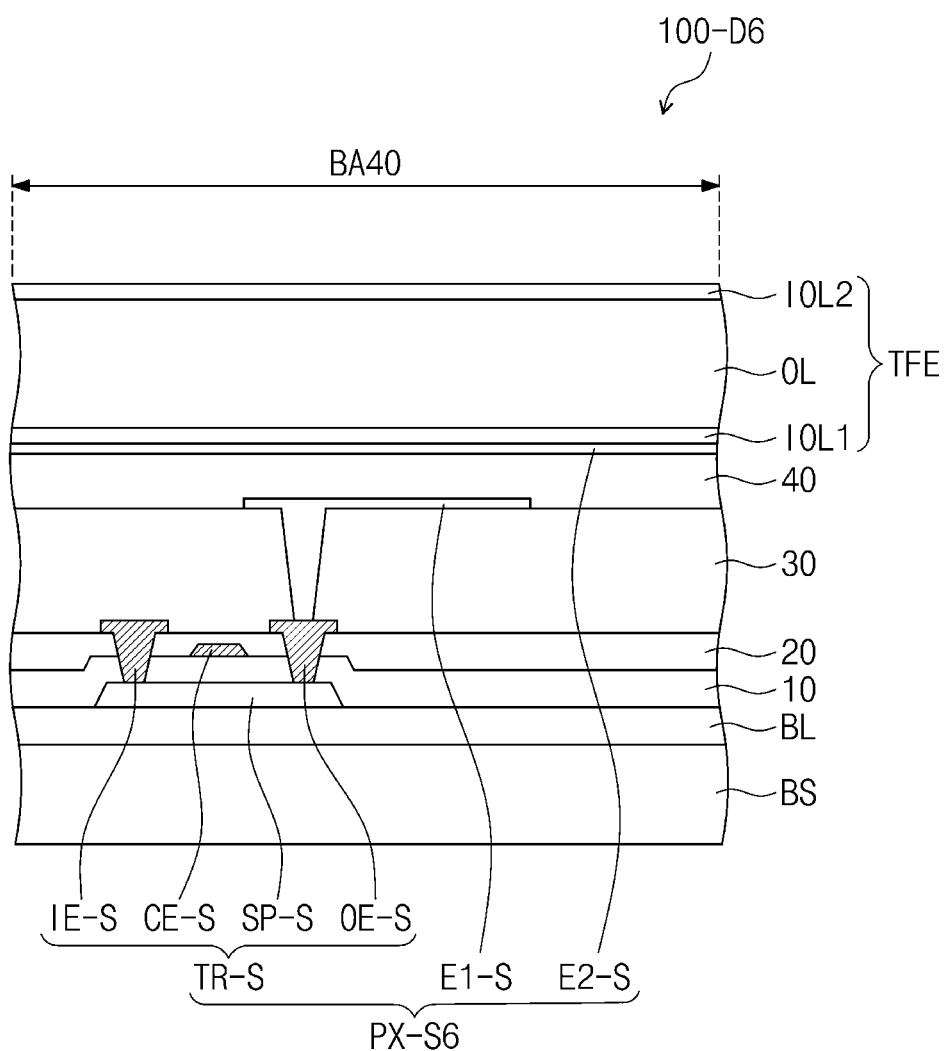

Alternatively, as illustrated in FIG. 9F, an opening OP (see FIG. 3B) corresponding to a compensation pixel PX-S6 may be omitted in the fourth insulating layer 40 in a display panel 100-D6. The display panel 100-D6 may include the compensation pixel PX-S6 including the thin film transistor TR-S, the first electrode E1-S, and the second electrode E2-S. Here, because the opening OP is not provided in the fourth insulating layer 40 in the compensation area BA40, the first electrode E1-S and the second electrode E2-S may be spaced apart from each other with the fourth insulating layer 40 interposed therebetween, unlike the compensation pixel PX-S2 of FIG. 9B.

Figure 9G:
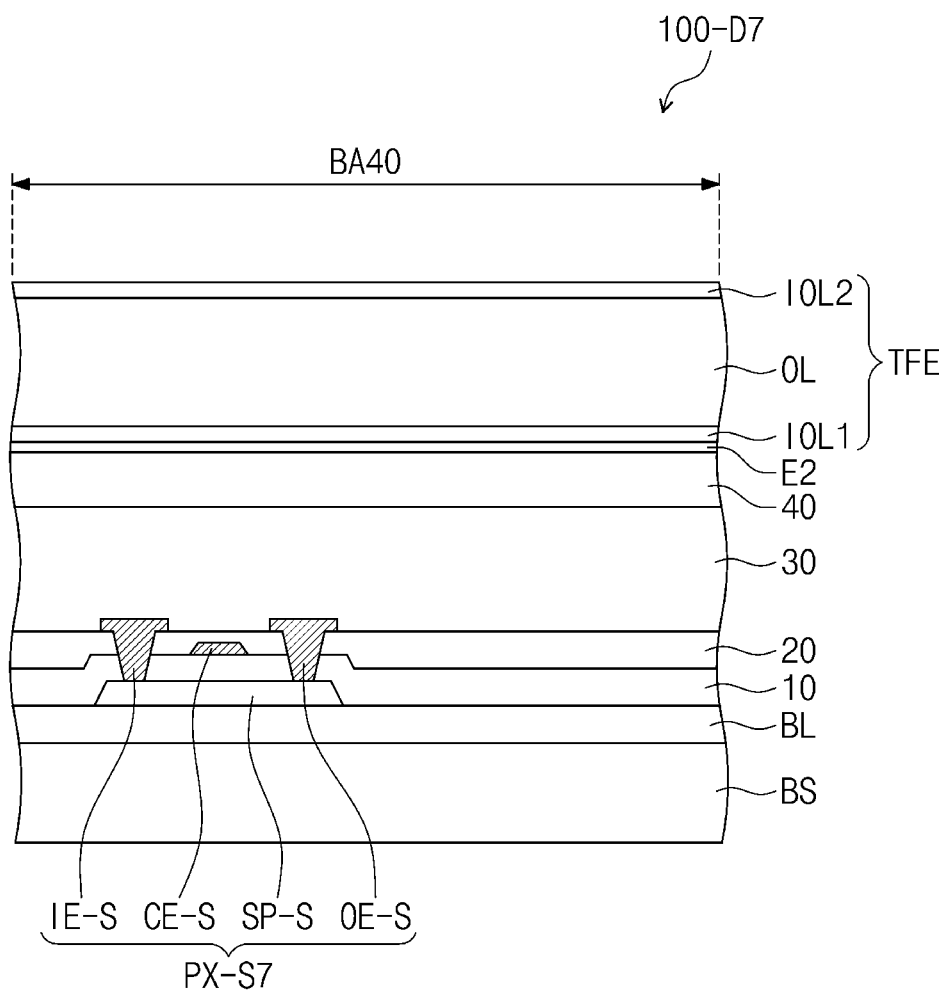

Alternatively, as illustrated in FIG. 9G, a display panel 100-D7 may include a compensation pixel PX-S7 having a structure that does not include the light emitting element ELD (see FIG. 3B) of the components of the pixel PX located in the display area DA (see FIG. 3B). The compensation pixel PX-S7 may have a structure including only the thin film transistor.

According to the embodiments of the present disclosure, the hole area PA40 (e.g., the compensation area BA40) may display the black color regardless of the image displayed in the display area DA. The compensation area BA40 may be shown as the black color through the compensation pixel PX-S1, PX-S2, PX-S3, PX-S5, PX-S6, or PX-S7 not generating light, or may generate the light of the low gray scale through the compensation pixel PX-S4 to display the black color. Thus, it is possible to prevent a defect (e.g., a spot) in the hole area PA40 from being visible to the outside. In addition, the compensation area BA40 may include the structure corresponding to that of at least one of the components of the display area DA, and thus processes may be simplified.

Figure 10A:
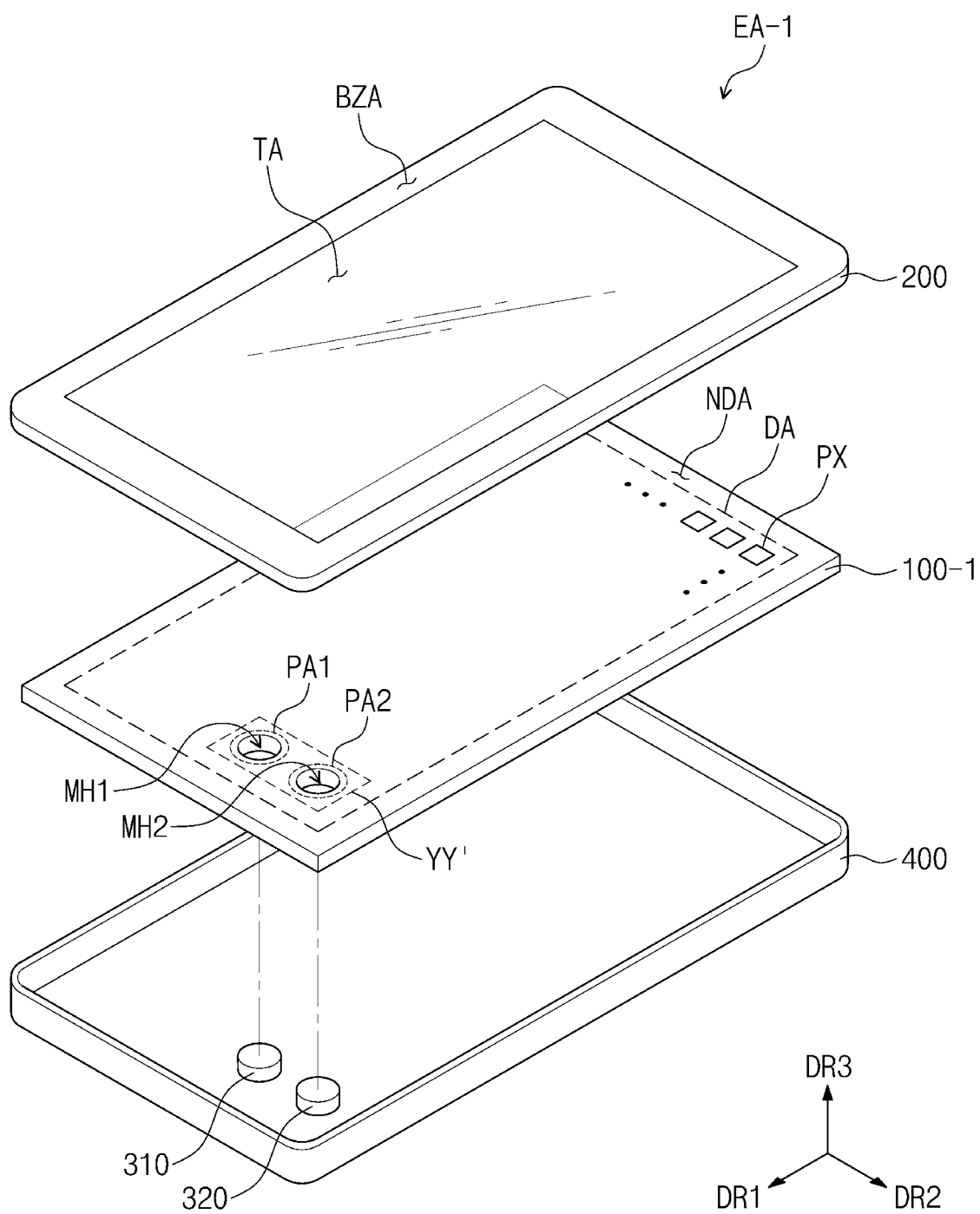
FIG. 10A is an exploded perspective view illustrating an electronic apparatus according to an embodiment of the present disclosure.
Figure 10B:
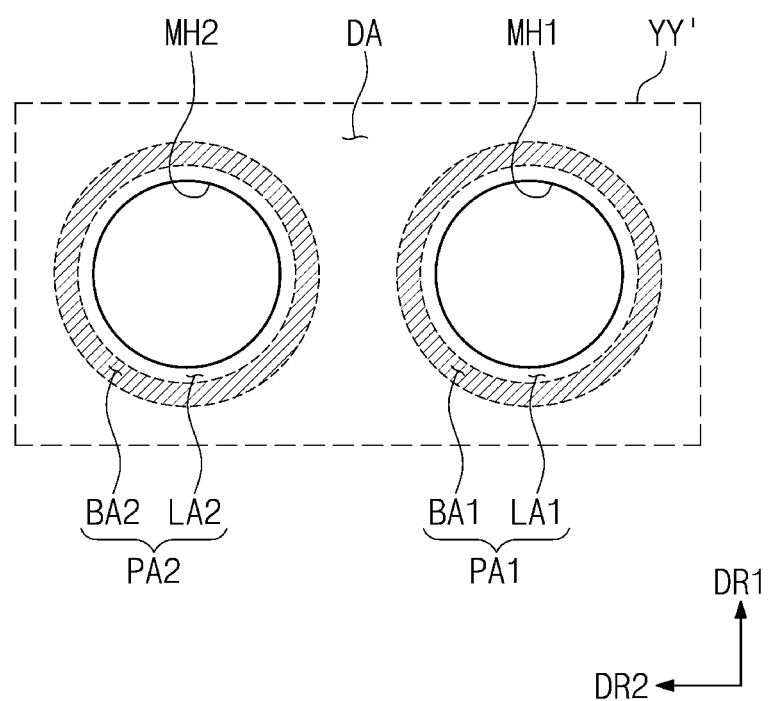
FIG. 10B is a plan view schematically illustrating the area YY' of FIG. 10A.

FIG. 10A is an exploded perspective view illustrating an electronic apparatus according to an embodiment of the present disclosure. FIG. 10B is a plan view schematically illustrating the area YY' of FIG. 10A. Hereinafter, an embodiment of the present disclosure will be described in detail with reference to FIGS. 10A and 10B. In the present embodiment, the same components as described with reference to FIGS. 1 to 9G will indicated by the same reference numerals or designators, and the descriptions thereto will omitted.

As illustrated in FIG. 10A, an electronic apparatus EA-1 may include a display panel 100-1, a window member 200, a plurality of electronic modules 310 and 320, and a receiving member 400. The window member 200 and the receiving member 400 may be substantially the same as the window member 200 and the receiving member 400 of FIGS. 1 and 2A, and thus the descriptions thereto are omitted.

Each of the electronic modules 310 and 320 may include at least one of the modules of the first and second electronic modules EM1 and EM2 illustrated in FIG. 2B. For example, each of the electronic modules 310 and 320 may include a camera, a speaker, and/or a sensor for sensing light or heat. The electronic modules 310 and 320 may include a first electronic module 310 and a second electronic module 320.

The first electronic module 310 and the second electronic module 320 may be the same as each other or may be different from each other.

The display panel 100-1 may include a plurality of module holes MH1 and MH2. The module holes MH1 and MH2 may correspond to the electronic modules 310 and 320, respectively. The module holes MH1 and MH2 may include a first module hole MH1 overlapping with the first electronic module 310 and a second module hole MH2 overlapping with the second electronic module 320.

The display panel 100-1 may include hole areas PA1 and PA2 which correspond to the module holes MH1 and MH2, respectively. The hole areas PA1 and PA2 may include a first hole area PA1 in which the first module hole MH1 is formed, and a second hole area PA2 in which the second module hole MH2 is formed.

Referring to FIG. 10B, the display area DA may surround the first hole area PA1 and the second hole area PA2. The first hole area PA1 and the second hole area PA2 may be spaced apart from each other when viewed in a plan view. The first hole area PA1 and the second hole area PA2 may include line areas LA1 and LA2 and compensation areas BA1 and BA2. In the present embodiment, lines located in the line areas LA1 and LA2 and pixels located in the display area DA are omitted for the purpose of ease and convenience in description and illustration.

The compensation area BA1 of the first hole area PA1 may display a black color, and the compensation area BA2 of the second hole area PA2 may also display the black color. The compensation areas BA1 and BA2 of the first and second hole areas PA1 and PA2 may be visible as areas showing the black color or may display light of the black color.

The compensation area BA1 of the first hole area PA1 and the compensation area BA2 of the second hole area PA2 may be spaced apart from each other. A portion of the display area DA may be located between the first hole area PA1 and the second hole area PA2. Thus, at least one pixel for displaying the image IM may be located between the first hole area PA1 and the second hole area PA2.

According to the present embodiment, the compensation areas BA1 and BA2 may be provided adjacent to the module holes MH1 and MH2, respectively, and thus it is possible to prevent defects (e.g., spots) adjacent to the module holes MH1 and MH2 from being visible to the outside. In addition, it is possible to prevent or reduce the likelihood of failure (e.g., distortion of an image) which may occur in areas adjacent the module holes MH1 and MH2 by electrical interaction between the display area DA and the line areas LA1 and LA2.

Figure 11A:
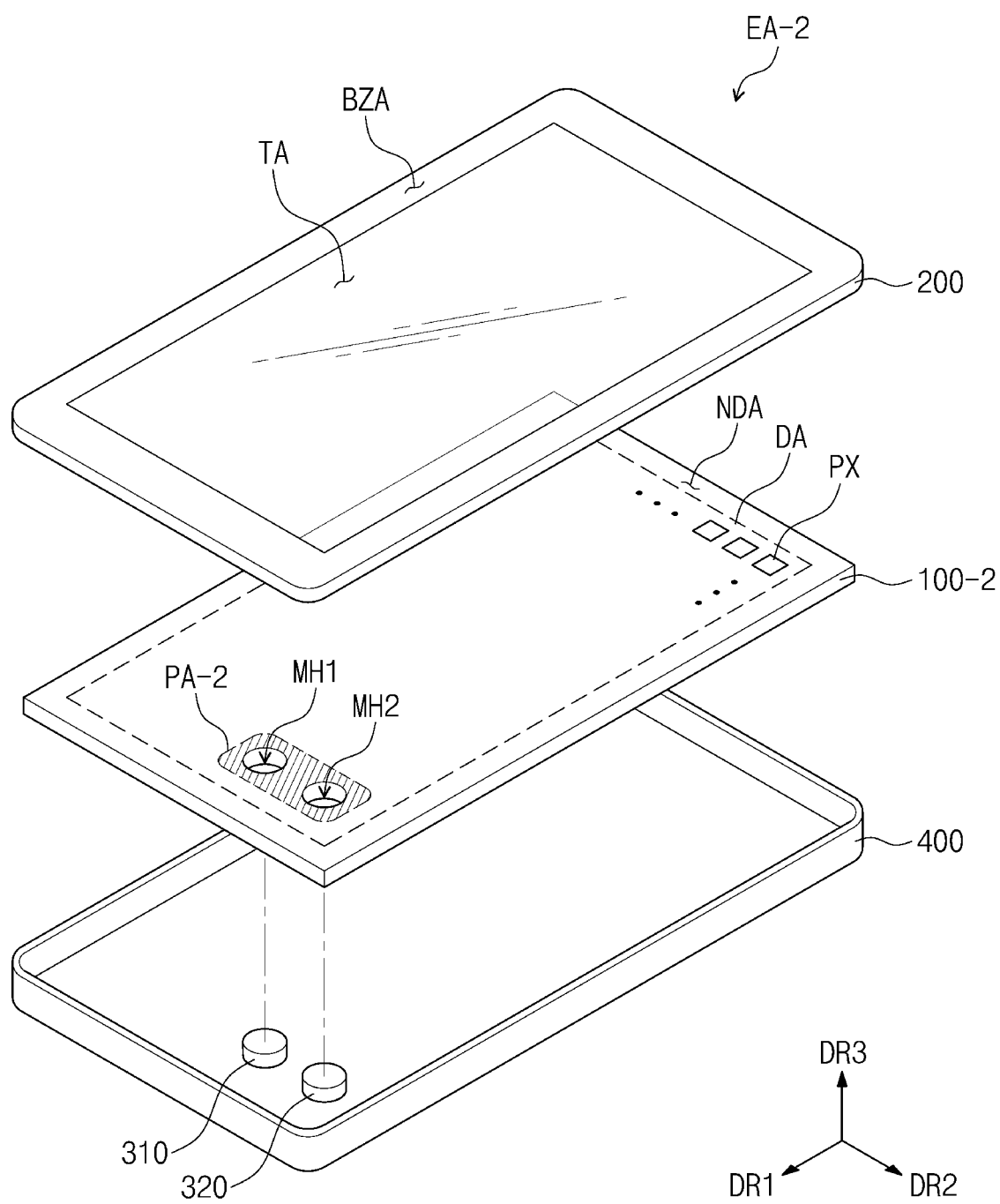
FIG. 11A is an exploded perspective view illustrating an electronic apparatus according to an embodiment of the present disclosure.
Figure 11B:
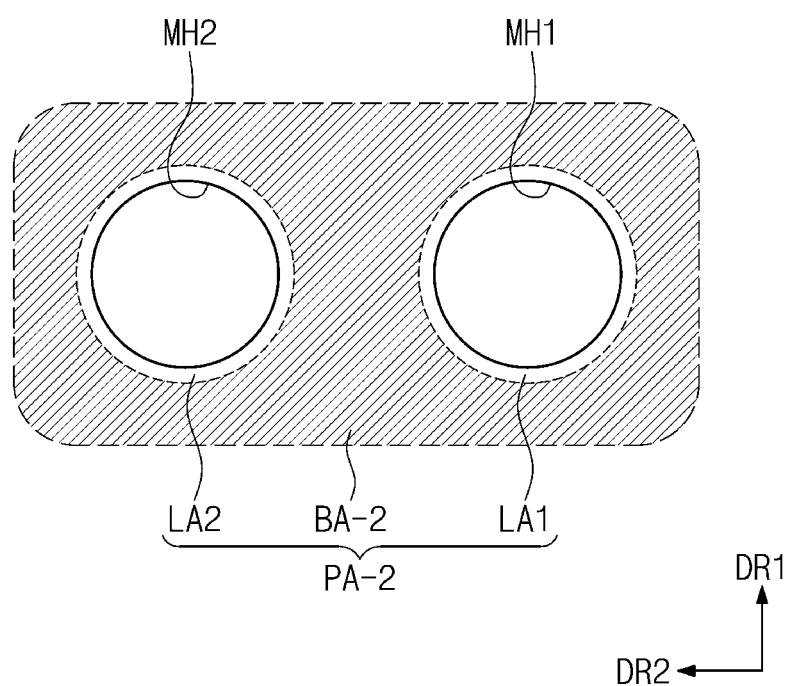
FIG. 11B is a plan view schematically illustrating a partial area of FIG. 11A.

FIG. 11A is an exploded perspective view illustrating an electronic apparatus according to an embodiment of the present disclosure. FIG. 11B is a plan view schematically illustrating a partial area of FIG. 11A. Hereinafter, an embodiment of the present disclosure will be described in detail with reference to FIGS. 11A and 11B. In the present embodiment, the same components as described with reference to FIGS. 1 to 10B will indicated by the same reference numerals or designators, and the descriptions thereto will omitted.

As illustrated in FIG. 11A, an electronic apparatus EA-2 may include a display panel 100-2, a window member 200, a plurality of electronic modules 310 and 320, and a receiving member 400. The window member 200, the electronic modules 310 and 320 and the receiving member 400 may be substantially the same as the window member 200, the electronic modules 310 and 320 and the receiving member 400 of FIG. 10A, and thus the descriptions thereto are omitted.

The display panel 100-2 may include first and second module holes MH1 and MH2 respectively corresponding to the electronic modules 310 and 320, and may include a hole area PA-2 in which the first and second module holes MH1 and MH2 are formed. In other words, in the present embodiment, a plurality of the module holes MH1 and MH2 may be formed in a single hole area PA-2.

FIG. 11B schematically illustrates the hole area PA-2. Referring to FIG. 10B, the hole area PA-2 may include a first line area LA1, a second line area LA2, and a compensation area BA-2. The first line area LA1 may be adjacent to the first module hole MH1, and may surround the first module hole MH1 in a plan view. A plurality of sub-signal lines may be located in the first line area LA1 and may surround the first module hole MH1.

The second line area LA2 may be adjacent to the second module hole MH2 and may surround the second module hole MH2 in a plan view. The second line area LA2 may be spaced apart from the first line area LA1 when viewed in a plan view. A plurality of sub-signal lines may be located in the second line area LA2, and may surround the second module hole MH2. The sub-signal lines may be the same as described above, and thus the descriptions thereto are omitted.

The compensation area BA-2 may be adjacent to the first line area LA1 and the second line area LA2. The compensation area BA-2 may surround each of the first line area LA1 and the second line area LA2. Thus, the first module hole MH1 and the second module hole MH2 may be surrounded by the single compensation area BA-2. The compensation area BA-2 may be visible as an area showing a black color or may display light of the black color.

According to the present embodiment, the plurality of module holes MH1 and MH2 may be formed in the single compensation area BA-2, and thus the compensation area BA-2 having a shape different from those of the module holes MH1 and MH2 may be easily formed. In addition, the compensation area BA-2 of a constant size may be formed regardless of the number of the module holes MH1 and MH2, and thus the display area DA may be easily and stably designed even when the number of the module holes MH1 and MH2 is changed.

According to the embodiments of the present disclosure, it is possible to prevent defects (e.g., spots) of the display panel, which may be otherwise caused by an external contaminant provided through the hole (e.g., the module hole), from being visible to the outside. In addition, according to the embodiments of the present disclosure, the pixels adjacent to the hole may be electrically shielded from various signal lines adjacent to the hole, and thus it is possible to inhibit the pixels from being affected by other signals except the electrical signals provided to the pixels. As a result, distortion of an image in an area adjacent to the hole may be reduced, minimized, or prevented to realize the display panel and the electronic apparatus, which are capable of providing uniform images. Accordingly, the disclosed embodiments provide improvements to display technology.

While the present disclosure have been described with reference to example embodiments, it will be apparent to those skilled in the art that various changes and modifications may be made without departing from the spirits and scopes of the present disclosure. Therefore, it should be understood that the above embodiments are not limiting, but illustrative. Thus, the scopes of the present disclosure are to be determined by the broadest permissible interpretation of the following claims including their functional equivalents, and shall not be restricted or limited by the foregoing description.

What is claimed is:

1. A display panel comprising:
an insulating substrate in which at least one hole is defined, wherein the insulating substrate comprises:
a hole area in which the hole is defined through the insulating substrate in a thickness direction of the insulating substrate;
a display area surrounding the hole area; and
a peripheral area adjacent to the display area;
a plurality of pixels in the display area;
a plurality of main signal lines in the display area and electrically connected to the pixels; and
a plurality of electrically conductive sub-signal lines in the hole area, circumferentially surrounding the hole, and electrically connected to the pixels and to respective ones of the main signal lines,
wherein the hole area comprises:
a line area which surrounds the hole, and in which the sub-signal lines are located; and
a compensation area between the line area and the display area in a plan view, and configured to display a black color.

2. The display panel of claim 1, further comprising an optically opaque metal pattern in the compensation area and spaced apart from the pixels in a plan view.

3. The display panel of claim 2, wherein the metal pattern is a floating electrode.

4. The display panel of claim 2, wherein the metal pattern is configured to receive a ground voltage.

5. The display panel of claim 2, wherein the metal pattern is configured to receive the same voltage as one of the sub-signal lines.

6. The display panel of claim 2, wherein the metal pattern and the sub-signal lines are on the same layer.

7. The display panel of claim 6, wherein the main signal lines are on a layer that is different from the layer on which the sub-signal lines are located.

8. The display panel of claim 2, wherein the metal pattern is on a layer that is different from a layer on which the sub-signal lines are located.

9. The display panel of claim 8, wherein at least one of the sub-signal lines is on the same layer as at least one of the main signal lines.

10. The display panel of claim 8, wherein the metal pattern extends into the line area, and
wherein the metal pattern overlaps with the sub-signal lines when viewed in a plan view.

11. The display panel of claim 2, further comprising an encapsulation layer covering the pixels,
wherein the metal pattern is located on the encapsulation layer.

12. The display panel of claim 1, further comprising a plurality of light emitting elements in the compensation area and spaced apart from the pixels in a plan view.

13. The display panel of claim 12, wherein each of the light emitting elements is electrically connected to at least one of the main signal lines or the sub-signal lines, and
wherein each of the light emitting elements is configured to display light of a black color.

14. The display panel of claim 12, wherein each of the light emitting elements is electrically insulated from the main signal lines and the sub-signal lines.

15. The display panel of claim 1, wherein the insulating substrate defines a plurality of holes spaced apart from each other,
wherein the hole area defines a plurality of hole areas respectively overlapping with the holes and spaced apart from each other, and
wherein each of compensation areas of the hole areas extends along an edge of each of the holes.

16. The display panel of claim 1, wherein the insulating substrate defines a plurality of holes spaced apart from each other,
wherein the hole area is provided as a single area overlapping with all of the holes, and
wherein the holes are surrounded by a single compensation area in a plan view.

17. An electronic apparatus comprising:
a display panel comprising:
a hole area defining a through-hole through the display panel in a thickness direction of the display panel, and configured to display a black color; and
a display area surrounding the hole area and configured to display an image by an electrical signal; and
an electronic module under the display panel and overlapping with the hole area,
wherein the hole area comprises:
a line area surrounding the through-hole; and
a compensation area between the line area and the display area and surrounding the line area,
wherein the display panel comprises:
a plurality of pixels in the display area;
a plurality of main signal lines in the display area and connected to the pixels;
a plurality of electrically conductive sub-signal lines in the line area, circumferentially surrounding the through-hole, and the sub-signal lines apart from the display area and electrically connected to the main signal lines; and
a compensation element in the compensation area and configured to display a black color.

18. The electronic apparatus of claim 17, wherein the compensation element comprises an optically opaque metal pattern covering the compensation area and spaced apart from the pixels in a plan view.

19. The electronic apparatus of claim 18, wherein the metal pattern overlaps with at least one of the main signal lines or the sub-signal lines when viewed in a plan view.

20. The electronic apparatus of claim 17, wherein each of the pixels comprises: a thin film transistor; and a light emitting element connected to the thin film transistor, and
wherein the compensation element has a structure obtained by omitting at least one of the thin film transistor or components of the light emitting element from the pixel.

21. The electronic apparatus of claim 17, wherein the compensation element comprises: a first electrode electrically insulated from the main signal lines and the sub-signal lines; a second electrode; and an emission layer between the first and second electrodes.

22. The electronic apparatus of claim 21, wherein the first electrode is a floating electrode.

23. The electronic apparatus of claim 17, wherein the compensation element has the same structure as at least one of the pixels, and is configured to generate light of a black color.

24. The electronic apparatus of claim 17, wherein the sub-signal lines have curved line shapes extending along at least a portion of an edge of the through-hole, and
wherein the main signal lines have straight line shapes.

* * * * *